(12) United States Patent
Ishimura et al.

(10) Patent No.: US 6,207,993 B1
(45) Date of Patent: Mar. 27, 2001

(54) FIELD EFFECT SEMICONDUCTOR DEVICE

(75) Inventors: Youichi Ishimura; Hiroshi Yamaguchi; Kazunari Hatade, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/250,726

(22) Filed: Feb. 16, 1999

(30) Foreign Application Priority Data

Sep. 2, 1998 (JP) .................................................. 10-248141

(51) Int. Cl.[7] .................................................. H01L 29/76
(52) U.S. Cl. ........................... 257/335; 257/341; 257/342
(58) Field of Search ................................ 257/335, 341, 257/342

(56) References Cited

U.S. PATENT DOCUMENTS

| | | | |
|---|---|---|---|
| 5,723,890 | 3/1998 | Fujihira et al. | 257/339 |
| 5,757,046 | 5/1998 | Fujihira et al. | 257/339 |
| 5,939,752 | * 8/1999 | Williams | 257/341 |

* cited by examiner

*Primary Examiner*—Mark V. Prenty
(74) *Attorney, Agent, or Firm*—Oblon, Spivak, McClelland, Maier & Neustadt, P.C.

(57) ABSTRACT

An $n^+$ semiconductor region (12) is formed in a lower portion (3a) of a p-type diffusion region (3) where a channel is created. The $n^+$ semiconductor region (12) is formed in a region extending from a one-side major surface of a semiconductor layer (100) up to the lower portion (3a) of the p-type diffusion region (3). The impurity concentration of the $n^+$ semiconductor region (12) is determined higher than that of a $n^-$ semiconductor region (2). With this structure, it is possible to reduce an on-resistance without deteriorating a withstand avalanche voltage.

12 Claims, 16 Drawing Sheets

FIELD EFFECT SEMICONDUCTOR DEVICE

BACKGROUND OF THE INVENTION

1. Field of the Invention

The present invention relates to a field effect semiconductor device, and more particularly to a field effect semiconductor device having a metal-oxide-semiconductor (MOS) structure in a semiconductor layer which is one of its constituents.

2. Description of the Background Art

A MOS semiconductor device is often used for a switching element because of its operation driven by voltage and relatively easy high-speed switching. FIGS. 15 and 16 show an example of a prior-art power MOSFET which is one of MOS semiconductor devices. FIG. 15 is a view showing a pattern of impurities formed in a surface of a semiconductor layer when viewed from its front-surface side of the power MOSFET, and FIG. 16 is a schematic section taken along the line A—A of FIG. 15. In FIG. 15, a gate electrode 6, an interlayer insulating film 7 and a source electrode 8 of FIG. 16 are omitted.

In the power MOSFET having the above structure, an $n^-$ semiconductor region 2 is formed in an $n^+$ semiconductor substrate 1. The $n^-$ semiconductor region 2 is a constituent of the semiconductor layer. The $n^-$ semiconductor region 2 is, for example, an epitaxial layer. A plurality of p-type diffusion regions 3 are arranged like islands in a surface of the $n^-$ semiconductor region 2, in other words, a one-side major surface of the semiconductor layer. The P-type diffusion region 3 has a planar shape of substantial square and a section of reverse-dome shape (downward convex) with flat bottom. Inside a surface of the p-type diffusion region 3, an $n^+$ source region 4 is formed. The $n^+$ source region 4 has a planar shape of rectangular ring and a substantially rectangular section. The $n^+$ source region 4 is covered with the p-type diffusion region 3 on the side of the semiconductor layer in order to serve as an FET. A gate insulating film 5 is so formed as to cover the surface of the p-type diffusion region 3 between the $n^+$ source region 4 and the $n^-$ semiconductor region 2 and the surface of the $n^-$ semiconductor region 2. In other words, the gate insulating film 5 is formed on the one-side major surface of the semiconductor layer above a channel region 10 between the annular peripheral portion of the annular $n^+$ source region 4 and the peripheral portion of the p-type diffusion region 3 which are adjacent to each other. On the gate insulating film 5 formed is the gate electrode 6 having almost the same planar shape as the gate insulating film 5. As a material of the gate electrode 6, for example, polysilicon is used. The interlayer insulating film 7 is so formed as to cover the gate electrode 6. The surface of the p-type diffusion region 3 inside the annular $n^+$ source region 4 and a portion of the surface of internal circumference side of the $n^+$ source region 4 are not covered with the interlayer insulating film 7. Since the source electrode 8 is deposited entirely on the one-side major surface of the semiconductor layer including above the interlayer insulating film 7, the source electrode 8 is in contact with the portion of the $n^+$ source region 4 which is not covered with the interlayer insulating film 7 and the p-type diffusion region 3 surrounded by the $n^+$ source region 4 on the one-side major surface of the semiconductor layer 100.

In the power MOSFET having the above structure, when a positive gate voltage is applied to the gate electrode 6 while applying a drain voltage such that the potential of the drain electrode 9 may become positive relative to the potential of the source electrode 8, the polarity of the surface of the p-type diffusion region 3 between the $n^+$ source region 4 and the $n^-$ semiconductor region 2 is reversed into n type, creating a channel in the channel region 10. In this state, an electronic current flows through the $n^+$ source region 4 and the channel region 10 into the $n^-$ semiconductor region 2, to bring the power MOSFET into conduction.

An on-resistance of this power MOSFET is classified into, for example, resistance elements as shown in FIG. 17. Reference signs given to the resistance elements of FIG. 17 are also used to represent values of the resistance elements. In FIG. 17, $Rn^+$ represents the resistance element of the $n^+$ source region 4, Rch represents a channel resistance element, Rac represents an accumulation resistance element of the silicon surface, Rj represents the resistance element of a junction FET (J-FET, thereafter) formed between the p-type diffusion regions 3 of adjacent MOS unit cells, Repi represents the resistance element of the $n^-$ semiconductor region 2 and Rsub represents the resistance element of the $n^+$ semiconductor substrate 1. The MOS unit cell refers to a structure including only one p-type diffusion region 3 existing like an island to serve as a MOSFET. When the on-resistance of the power MOSFET is represented as Ron, the on-resistance Ron is obtained from Formula 1:

$$Ron = Rn^+ + Rch + Rac + Rj + Repi + Rsub \quad (1)$$

In order to reduce the on-resistance of the power MOSFET, it is necessary to lower the resistance elements of Formula 1. To lower the channel resistance element Rch, it is effective to increase a channel width. To increase the channel width, it is effective to increase the cell density of the MOS unit cell with size reduction of the p-type diffusion region 3.

FIG. 18 is a schematic section showing a prior-art vertical MOSFET shown in, for example, Japanese Patent Application Laid Open Gazette 3-70387. To lower the resistance element Rj of the J-FET formed between the p-type diffusion regions 3, as shown in FIG. 18, it is effective to form an $n^+$ diffusion region 12 between the p-type diffusion regions. The prior-art $n^+$ diffusion region 12 is formed on the periphery of a region in which a plurality of MOS unit cells are disposed. Providing the $n^+$ diffusion region 12 produces an effect of reducing the spacing between the p-type diffusion regions 3 without increasing the resistance element Rj, by which the channel resistance element Rch can be lowered.

FIG. 17 also shows an equivalent circuit model of the MOS unit cell. Elements constituting the equivalent circuit model will be described below with reference to FIG. 17. A parasitic npn transistor exists therein, consisting of the $n^+$ source region 4, the p-type diffusion region 3 and the $n^-$ semiconductor region 2. The base of the parasitic npn transistor is connected to the source electrode 8 through a diffusion base resistance Rb. The emitter of the parasitic npn transistor is connected to the source electrode 8 through the resistance element $Rn^+$ of the source region 4. The resistance element $Rn^+$ of the source region 4, together with the channel resistance element Rch, the accumulated resistance element Rac, the resistance element Rj of the J-FET, the resistance element Repi of the $n^-$ semiconductor region 2 and the resistance element Rsub of the semiconductor substrate 1 which are connected in series to the resistance element $Rn^+$, constitutes the resistance element Ron of the power MOSFET. Representing a potential difference between the $n^+$ source region 4 and the p-type diffusion region 3, an avalanche current and a diffusion base resistance immediately below the $n^+$ source region 4 as Vb, Jb and Rb, respectively, when the condition of Formula 2 is satisfied, the n⁺ source region 4 and the p-type diffusion region 3 are brought into a forward bias state, to bring the parasitic npn transistor into conduction.

$$Vb = Jb \times Rb \geq \text{about } 0.6V \quad (2)$$

To turn off the power MOSFET, it is necessary to bring the gate electrode 6 into the same potential as that of the source electrode 8 or a negative potential. At this time, the magnitude of a voltage to be applied across the source electrode 8 and the drain electrode 9 depends on the voltage breakdown resistant characteristics of a diode formed in the p-type diffusion region 3 and the n⁻ semiconductor region 2. A breakdown of the power MOSFET causes the avalanche current to flow.

When the parasitic npn transistor becomes conducting, a current flows locally, which breaks down the power MOSFET. To prevent conduction of the parasitic npn transistor, it is effective to reduce the avalanche current Jb and lower the diffusion base resistance Rb. To reduce the avalanche current Jb, there is a method of preventing formation of a path for the avalanche current immediately below the n⁺ source region 4. Not to flow the avalanche current immediately below the n⁺ source region 4, it is effective to form a p-type diffusion region 11 deeper than the p-type diffusion region 3 as shown in FIG. 18. The depth of the n⁺ diffusion region 12 is determined shallower than a lower portion of the p⁺ diffusion region 11. In other words, the n⁺ source region 4 is connected to the n⁻ semiconductor region 2 through the p-type regions surrounding the n⁺ source region 4, i.e., the p-type diffusion region 3 and the p⁺ diffusion region 11. In order to lower the diffusion base resistance Rb, it is effective to increase the concentration of the p-type diffusion region 3 or form another high-concentration p-type diffusion region inside the p-type diffusion region 3.

Japanese Patent Application Laid Open Gazette 8-227993 shows a technique to improve a withstand avalanche voltage with a structure different from the above.

In a switching device like the power MOSFET, to promote energy savings and simplification of circuit design, it is desirable that the loss of energy of the device on switching or in an on state should be as small as possible. Therefore, reduction in switching loss and on-resistance is the most critical issue for the switching device.

Now studied will be on reduction of on-resistance by lowering the resistance elements Rj and Rch. As discussed earlier, one of the methods for lowering the resistance elements Rj and Rch is to form the n⁺ diffusion resistance 12 in the surface of the n⁻ semiconductor region 2. Relations shown in FIG. 19 are held between the amount of phosphorus injected for forming the n⁺ diffusion region 12 and the on-resistance Ron and between the spacing between the p-type diffusion regions 3 and the on-resistance Ron. Specifically, as the concentration of the n⁺ diffusion region 12 becomes higher, the on-resistance Ron becomes lower and as the spacing between the p-type diffusion regions 3 becomes wider, the on-resistance Ron becomes lower.

On the other hand, widening the spacing between the p-type diffusion regions 3 and increasing the amount of phosphorus injected for forming the n⁺ diffusion region 12 cause a decrease of the withstand voltage. FIG. 20 shows relations between the amount of phosphorus injected for forming the n⁺ diffusion region 12 and the withstand voltage $V_{DSS}$ and between the spacing between the p-type diffusion regions 3 and the withstand voltage $V_{DSS}$. As the amount of phosphorus injected for forming the n⁺ diffusion region 12 increases, the withstand voltage $V_{DSS}$ decreases. As the spacing between the p-type diffusion regions 3 is widened, the withstand voltage decreases, and this tendency becomes more pronounced as the amount of injected phosphorus increases. This phenomenon results from that an electric field strength is increased by widening the spacing between the p-type diffusion regions 3 and increasing the amount of injected phosphorus. Because of the need for ensuring a desired withstand voltage, the spacing between the p-type diffusion regions 3 should not be indiscriminately widened and the amount of injected phosphorus should not be indiscriminately increased. Therefore, it is necessary to determine the spacing between the p-type diffusion regions 3 and the amount of phosphorus injected for forming the n⁺ diffusion region 12 in consideration of both the withstand voltage and the on-resistance.

In the prior-art field effect semiconductor device, the impurity concentration of the n⁺ diffusion region 12 is determined uniform in the surface of the semiconductor layer though it is determined in consideration of the trade-off relation between the withstand voltage and the on-resistance as discussed above. For example, as shown in FIG. 15, even if the spacings between the MOS unit cells, i.e., the spacings a and b between the p-type diffusion regions 3, are different since the MOS unit cells are polygons in the power MOSFET, the impurity concentration of the n⁺ diffusion region 12 is determined in accordance with the spacing b lest the withstand voltage should decrease in the wider spacing b. For this reason, the relation between the withstand voltage and the on-resistance is not optimal in the spacing a.

In some cases, in order to prevent the parasitic npn transistor from turning on when the avalanche current flows in the power MOSFET, the p-type diffusion region 11 is formed near the center of a lower portion of the p-type diffusion region 3 so as to be deeper than the lower portion of the p-type diffusion region 3 as discussed with reference to FIG. 18. An influence of the p-type diffusion region 11 on the on-resistance will be discussed with reference to FIGS. 21 to 23. FIGS. 21 to 23 show simulations of the on-resistance of the a 60 V-system power MOSFET. In FIGS. 21 to 23, lines with the reference signs J1 to J12 are equivalent current density lines and a reference sign of larger number represents a higher current density. In FIGS. 21 to 23, the equivalent current density lines with the same reference sign show the same current density. The power MOSFET of FIGS. 21 to 23 have the same structural conditions except existence of the p-type diffusion region 11 and its depth. From FIGS. 21 to 23, it can be seen that a relatively high current density is distributed up to near the center of the lower portion of the p-type diffusion region 3. From these figures, it can be also seen that the p⁺ diffusion region 11 has an effect on an electron density distribution as it becomes deeper and when the p⁺ diffusion region 11 exists or it is deepen, a range for high current density distribution is narrowed to increase the on-resistance. Though the p-type diffusion region 11 is formed near the center of the lower portion of the p-type diffusion region 3 for the purpose of improving the withstand avalanche voltage in the prior art, forming the p⁺ diffusion region 11 has an ill-effect on the on-resistance, increasing the on-resistance.

SUMMARY OF THE INVENTION

The present invention is directed to a field effect semiconductor device. According to a first aspect of the present invention, the field effect semiconductor device comprises a semiconductor layer of a first conductivity type having a one-side major surface and an other-side major surface which are opposed to each other. In the field effect semiconductor device of the first aspect, the semiconductor layer includes a first semiconductor region of a second conductivity type disposed like an island in the one-side major surface of the semiconductor layer, a second semiconductor region of the first conductivity type provided in a surface of the first semiconductor region so that its side of the semiconductor layer may be covered with the first semiconductor region, a third semiconductor region of the first conductivity type disposed in the one-side major surface of the semiconductor layer, extending from the one-side major surface of the semiconductor layer on the periphery of the first semiconductor region to beneath a lower portion of the first semiconductor region, and a fourth semiconductor region of the second conductivity type disposed in the one-side major surface of the semiconductor layer away from the first semiconductor region. The field effect semiconductor device of the first aspect further comprises: an insulating film covering a portion of a surface of the second semiconductor region and a channel region which exists between the second semiconductor region and the third semiconductor region in the surface of the first semiconductor region; a gate electrode provided on the insulating film above the channel region, a source electrode disposed so as to come into a contact with the first, second and fourth semiconductor regions; and a drain electrode connected to the other-side major surface of the semiconductor layer. In the field effect semiconductor device of the first aspect, the third semiconductor region has an impurity concentration higher than that of the semiconductor layer surrounding the third semiconductor region and is disposed in a portion except beneath a lower portion of the fourth semiconductor region, and the semiconductor layer is thinner beneath the fourth semiconductor region than beneath the first semiconductor region.

According to a second aspect of the present invention, in the field effect semiconductor device of the first aspect, the semiconductor layer is thinner beneath the fourth semiconductor region than beneath the first semiconductor region since the fourth semiconductor region is so provided as to extend from the one-side major surface of the semiconductor layer up to a portion deeper than the first semiconductor region.

According to a third aspect of the present invention, in the field effect semiconductor device of the first or second aspect, the semiconductor layer includes a plurality of first semiconductor regions, and the semiconductor layer has first and second exposed regions where surfaces of the third semiconductor region are exposed between adjacent ones of the plurality of first semiconductor regions or between one of the plurality of first semiconductor regions and the fourth semiconductor region in the one-side major surface, and an impurity concentration is higher in one of the first and second exposed regions which exists in a narrower spacing between the adjacent ones of the plurality of first semiconductor regions or between the one of the plurality of first semiconductor regions and the fourth semiconductor region.

According to a fourth aspect of the present invention, the field effect semiconductor device comprising a semiconductor layer of a first conductivity type having a one-side major surface and an other-side major surface which are opposed to each other. In the field effect semiconductor device of the fourth aspect, the semiconductor layer includes a plurality of first semiconductor regions of a second conductivity type disposed like islands in the one-side major surface of the semiconductor layer, a second semiconductor region of the first conductivity type provided in a surface of each of the plurality of first semiconductor regions so that its side of the semiconductor layer may be covered with each of the plurality of first semiconductor regions, a third semiconductor region of the first conductivity type disposed on the periphery of each of the plurality of first semiconductor regions in the one-side major surface of the semiconductor layer, having an impurity concentration higher than that of the semiconductor layer which is adjacent thereto, and a fourth semiconductor region of the second conductivity type disposed in the one-side major surface of the semiconductor layer away from each of the plurality of first semiconductor regions. The field effect semiconductor device of the fourth aspect further comprises: an insulating film covering a portion of a surface of the second semiconductor region and a channel region which exists between the second semiconductor region and the third semiconductor region in the surface of each of the plurality of first semiconductor regions; a gate electrode provided on the insulating film above the channel region, a source electrode disposed so as to come into a contact with the first, second and fourth semiconductor regions; and a drain electrode connected to the other-side major surface of the semiconductor layer. In the field effect semiconductor device of the fourth aspect, the semiconductor layer has first and second exposed regions where surfaces of the third semiconductor region are exposed between adjacent ones of the plurality of first semiconductor regions or between one of the plurality of first semiconductor regions and the fourth semiconductor region in the one-side major surface, and an impurity concentration is higher in one of the first and second exposed regions which exists in a narrower spacing between the adjacent ones of the plurality of first semiconductor regions or between the one of the plurality of first semiconductor regions and the fourth semiconductor region.

According to a fifth aspect of the present invention, in the field effect semiconductor device of the third or fourth aspect, the impurity concentration of the first exposed region and the impurity concentration of the second exposed region in the third semiconductor region are so controlled as to be in inverse proportion to the square of the spacing between the adjacent ones of the plurality of first semiconductor regions or between the one of the plurality of first semiconductor regions and the fourth semiconductor region.

According to a sixth aspect of the present invention, in the field effect semiconductor device of any of the third to fifth aspects, one of the first and second exposed regions which exists in the narrower spacing is deeper than the other which exists in a wider spacing.

According to a seventh aspect of the present invention, the field effect semiconductor device comprises a semiconductor layer of a first conductivity type having a one-side major surface and an other-side major surface which are opposed to each other. In the field effect semiconductor device of the seventh aspect, the semiconductor layer includes a plurality of first semiconductor regions of a second conductivity type disposed like islands in the one-side major surface of the semiconductor layer, a second semiconductor region of the first conductivity type provided in a surface of each of the plurality of first semiconductor regions so that its side of the semiconductor layer may be covered with each of the plurality of first semiconductor regions, a third semiconductor region of the first conductivity type disposed on the periphery of each of the plurality of first semiconductor regions in the one-side major surface of the semiconductor layer, having an impurity concentration higher than that of the semiconductor layer which is adjacent thereto, and a fourth semiconductor region of the second conductivity type disposed in the one-side major surface of the semiconductor layer away from each of the plurality of first semiconductor regions. The field effect semiconductor device of the seventh aspect further comprises: an insulating film covering a portion of a surface of the second semiconductor region and a channel region which exists between the second semiconductor region and the third semiconductor region in the surface of each of the plurality of first semiconductor regions; a gate electrode provided on the insulating film above the channel region, a source electrode disposed so as to come into a contact with the first, second and fourth semiconductor regions; and a drain electrode connected to the other-side major surface of the semiconductor layer. In the field effect semiconductor device of the seventh aspect, the semiconductor layer has a first exposed region where a surface of the third semiconductor region is exposed in a narrower spacing between adjacent ones of the plurality of first semiconductor regions or between one of the plurality of first semiconductor regions and the fourth semiconductor region in the one-side major surface and a second exposed region where the semiconductor layer which has an impurity concentration lower than that of the third semiconductor region is exposed in a wider spacing.

According to an eighth aspect of the present invention, the field effect semiconductor device of any of the first to seventh aspects further comprises a fifth semiconductor region of the second conductivity type disposed in the semiconductor layer so as to be shallower than the fourth semiconductor region near the center of the lower portion of the first semiconductor region, wherein the third semiconductor region is so disposed as to extend up to beneath the fifth semiconductor region.

In the field effect semiconductor device of the first aspect, since the third semiconductor region is disposed beneath the first semiconductor region, the on-resistance can be reduced by lowering the resistance value at a portion of high current density and the withstand avalanche voltage can be improved because the avalanche current is easier to flow towards the fourth semiconductor region disposed deeper than the first semiconductor region as compared with the first semiconductor region.

The field effect semiconductor device of the second aspect produces an effect of simplifying a manufacturing process since both the first and fourth semiconductor regions can be formed by injecting impurities from the one-side major surface of the semiconductor layer.

In the field effect semiconductor device of the third and fourth aspects, since the impurity concentration in a region between the adjacent first semiconductor regions or between the first semiconductor region and the fourth semiconductor region is controlled in accordance with the spacing between the adjacent first semiconductor regions or between the first semiconductor region and the fourth semiconductor region, the on-resistance can be reduced through optimization of the withstand avalanche voltage and the on-resistance.

In the field effect semiconductor device of the fifth aspect, since the pinch-off voltage value can be kept constant regardless of the spacing between the adjacent first semiconductor regions or between the first semiconductor region and the fourth semiconductor region, the major withstand voltage can be improved.

In the field effect semiconductor device of the sixth aspect, since more parameters on the relation between the on-resistance and the withstand avalanche voltage can be obtained by providing a portion with the wider spacing so as to be deeper from the one-side major surface than a portion with the narrower spacing, the degree of freedom for design can be increased.

In the field effect semiconductor device of the seventh aspect, since the impurity concentration in a region between the adjacent first semiconductor regions or between the first semiconductor region and the fourth semiconductor region is controlled in accordance with the spacing between the adjacent first semiconductor regions or between the first semiconductor region and the fourth semiconductor region by exposing the semiconductor layer in the one-side major surface of the semiconductor layer, an increase in the number of manufacturing steps can be suppressed and optimized determinations of the withstand avalanche voltage and the on-resistance can be easily achieved, to reduce the on-resistance.

In the field effect semiconductor device of the eighth aspect, with the fifth semiconductor region, the withstand avalanche voltage can be further improved.

An object of the present invention is to lower the on-resistance without deteriorating the withstand avalanche voltage in a field effect semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
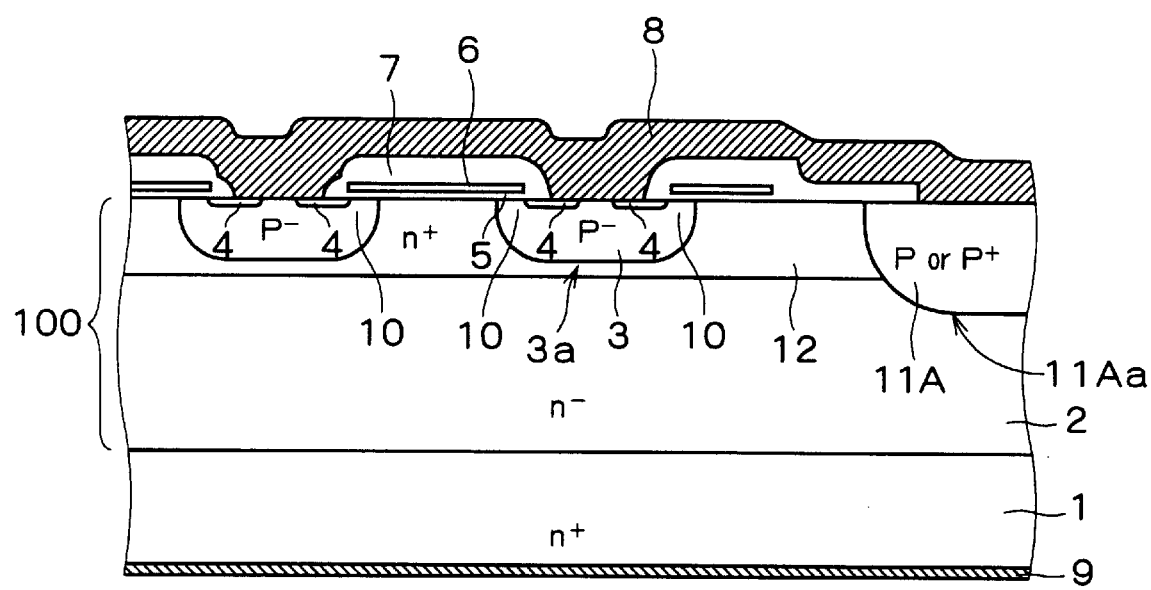
FIG. 1 is a schematic section showing a structural example of a power MOSFET in accordance with a first preferred embodiment.
Figure 15:
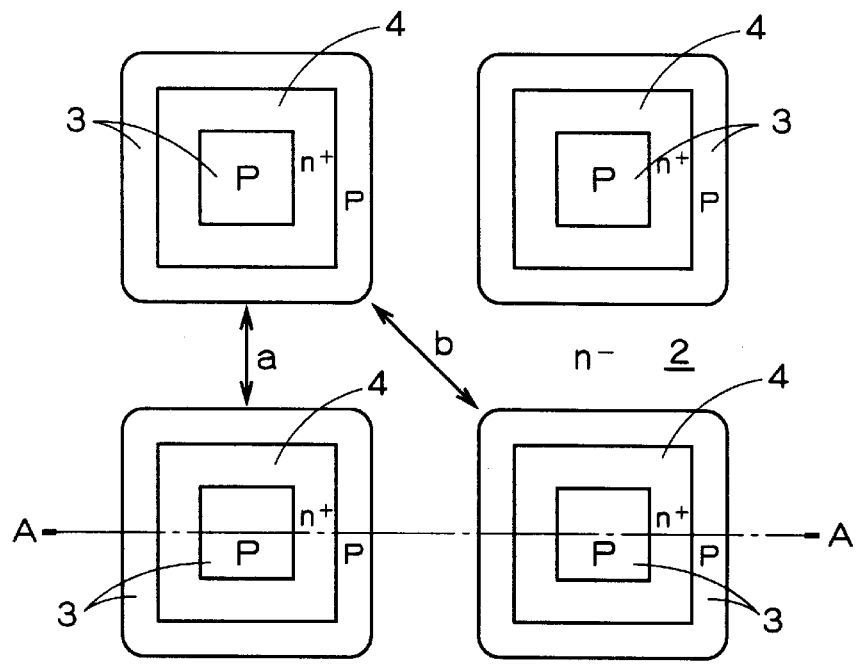
FIG. 15 is a pattern view showing a pattern of impurity of a power MOSFET in the prior art when viewed from the front.
Figure 16:
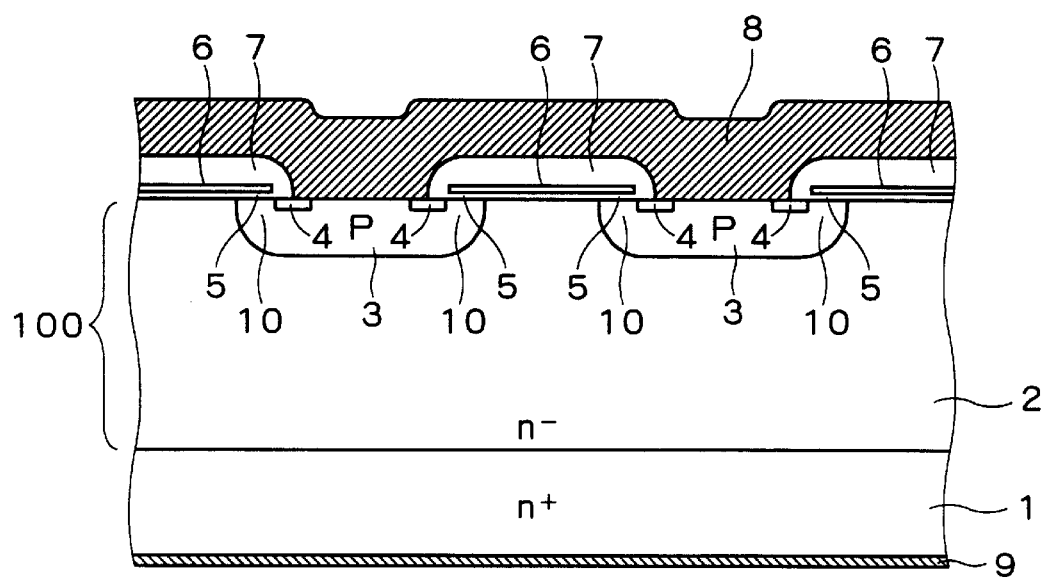
FIG. 16 is a schematic section showing an example of sectional structure of the power MOSFET in the prior art.
Figure 17:
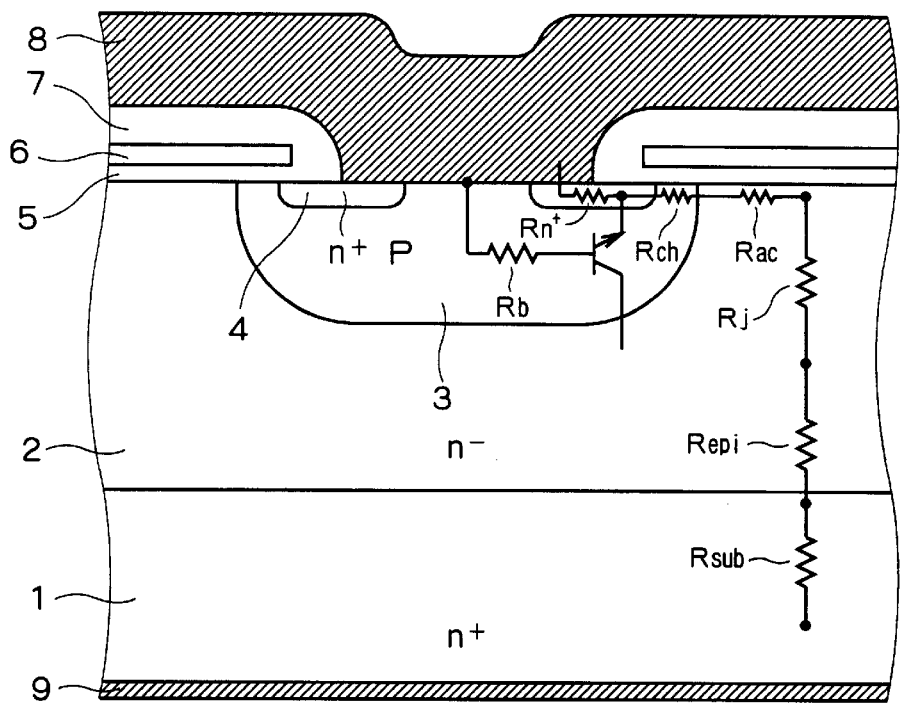
FIG. 17 is a view showing an equivalent circuit model of the power MOSFET in the prior art.

A field effect semiconductor device in accordance with the first preferred embodiment of the present invention will be discussed below. Discussion will be made taking a power MOSFET for example of the field effect semiconductor device of the first preferred embodiment. FIG. 1 is a schematic section showing a structural example of the power MOSFET in accordance with the first preferred embodiment. Elements of FIGS. 1 and 15 with the same reference sign correspond to each other.

Also in the power MOSFET of the first preferred embodiment, the $n^-$ semiconductor region 2 is formed in the surface of the $n^+$ semiconductor substrate 1. The $n^-$ semiconductor region 2 is a constituent of the semiconductor layer 100 and is made of, for example, an epitaxial layer. A plurality of p-type diffusion regions 3 are arranged like islands in the surface of the $n^-$ semiconductor region 2, i.e., one-side major surface of the semiconductor layer 100. The P-type diffusion region 3 has a section of reverse-dome shape (downward convex) with flat bottom and a planar shape of substantial square shown in FIG. 15. The p-type diffusion region 3 corresponds to a first semiconductor region. Inside the surface of the p-type diffusion region 3, the $n^+$ source region 4 is formed. The $n^+$ source region 4 has a substantially rectangular section and a planar shape of rectangular ring shown in FIG. 15. The $n^+$ source region 4 corresponds to a second semiconductor region. The $n^+$ semiconductor region 12 is formed as a third semiconductor region in the one-side major surface of the semiconductor layer 100, i.e., above the $n^-$ semiconductor region 2 so as to be deeper than the p-type diffusion region 3. The gate insulating film 5 is so formed as to cover the surface of the p-type diffusion region 3 between the $n^+$ source region 4 and the $n^+$ semiconductor region 12 and a surface of the $n^+$ semiconductor region 12. The gate insulating film 5 corresponds to an insulating film covering the channel region 10 between the second semiconductor region and the third semiconductor region in a surface of the first semiconductor region. In other words, the gate insulating film 5 is formed on the one-side major surface of the semiconductor layer 100 above the channel region 10. On the gate insulating film 5 formed is the gate electrode 6 having almost the same planar shape as the gate insulating film 5. As a material of the gate electrode 6, for example, polysilicon is used like in the prior art. The interlayer insulating film 7 is so formed as to cover the gate electrode 6. A portion of the surface of the $n^+$ source region 4 and the surface of the p-type diffusion region 3 surrounded by the $n^+$ source region 4 are not covered with the interlayer insulating film 7. Since the source electrode 8 is deposited entirely on the one-side major surface of the semiconductor layer 100 including above the interlayer insulating film 7, the source electrode 8 is in contact with the portion of the $n^+$ source region 4 and the p-type diffusion region 3 surrounded by the $n^+$ source region 4 which are not covered with the interlayer insulating film 7.

The $n^+$ semiconductor region 12 has an impurity concentration higher than that of the $n^-$ semiconductor region 2. The $n^+$ semiconductor region 12 is formed by injecting an impurity from the one-side major surface of the semiconductor layer 100, i.e., the surface of the $n^-$ semiconductor region 2. Since the $n^+$ semiconductor region 12 is formed deeper than a lower portion 3a of the p-type diffusion region 3, the $n^+$ semiconductor region 12 is so disposed as to cover the p-type diffusion region 3. The $n^+$ semiconductor region 12 is also so disposed as to fill between a plurality of p-type diffusion regions 3. In the one-side major surface of the semiconductor layer 100, a $p^+(p)$ diffusion region 11A having an impurity concentration as high as to about ten times as high as that of the p-type diffusion region 3 is formed away from the p-type diffusion region 3. The $p^+(p)$ diffusion region 11A corresponds to the second semiconductor region. The $n^+$ semiconductor region 12 is also formed between the $p^+(p)$ diffusion region 11A and the p-type diffusion region 3. The $p^+(p)$ diffusion region 11A is so formed as to be deeper than the lower portion 3a of the p-type diffusion region 3. Beneath a lower portion 11Aa of the $p^+(p)$ diffusion region 11A formed is the $n^-$ semiconductor region 2 having an impurity concentration lower than that of the $n^+$ semiconductor region 12. In part of the surface of the $p^+(p)$ diffusion region 11A, there is a portion not covered with the interlayer insulating film 7, and therefore the source electrode 8 is also in contact with the surface of the $p^+(p)$ diffusion region 11A. The drain electrode 9 is formed on the opposite side of the $n^-$ semiconductor region 2, i.e., the surface of the $n^+$ semiconductor substrate 1 on the other-side major surface of the semiconductor layer 100, and is electrically connected to the $n^-$ semiconductor region 2.

Figure 2:
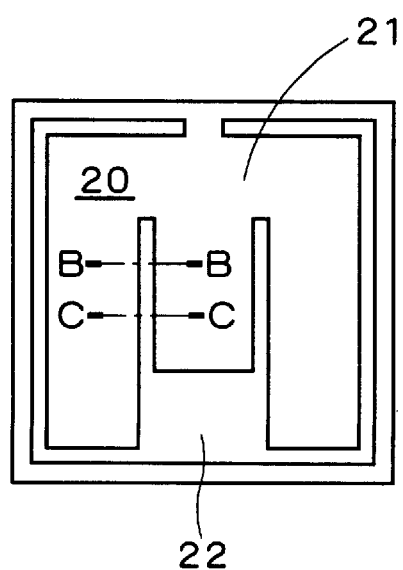
FIG. 2 is a plan view showing a structural example of the power MOSFET in accordance with the first preferred embodiment.
Figure 3:
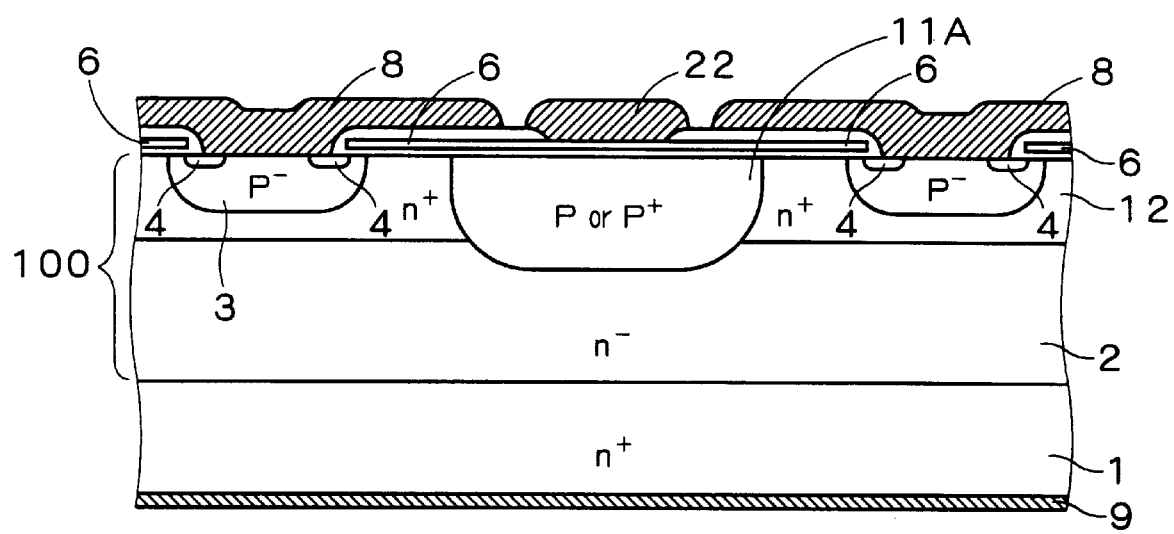
FIG. 3 is a schematic section showing a section taken along the line B—B of FIG. 2.
Figure 4:
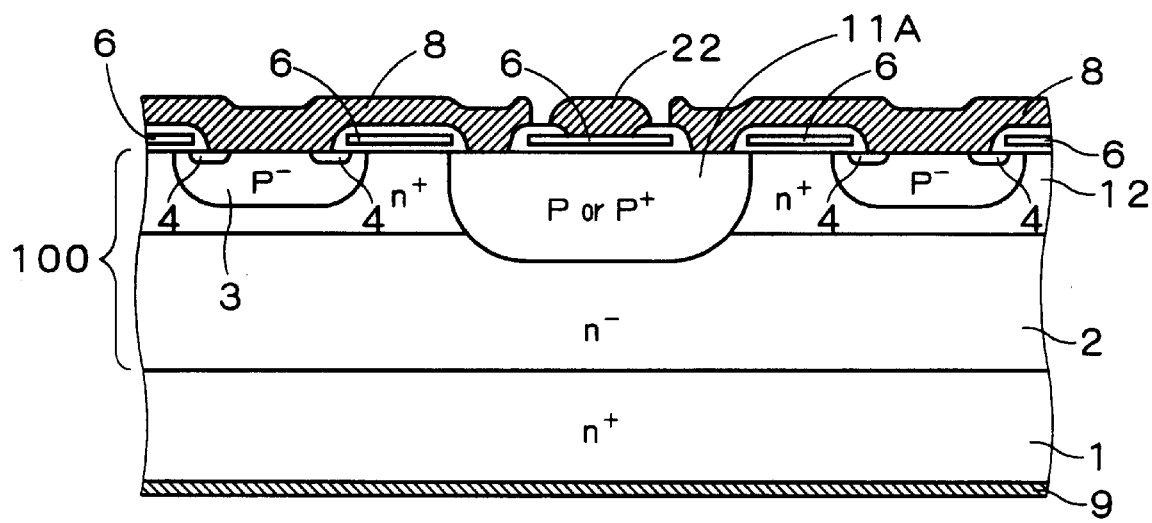
FIG. 4 is a schematic section showing a section taken along the line C—C of FIG. 2.

Next, brief discussion will be made on an overall structure of the power MOSFET. FIG. 2 is a plan view showing an example of overall structure of the power MOSFET in accordance with the first preferred embodiment. In a surface of the power MOSFET 20 exists a region 21 in which a MOS unit cell is disposed. The MOS unit cell of FIG. 1 is formed in the region 21 and the source region 8 is formed in a surface of the region 21. FIGS. 3 and 4 are schematic sections showing sections taken along the lines B—B and C—C of FIG. 2. As shown in FIGS. 2 to 4, the $p^+(p)$ diffusion region 11A is disposed at the center of the power MOSFET as well as on its periphery. As shown in FIG. 4, the $p^+(p)$ diffusion region 11A at the center is also electrically connected to the source electrode 8.

In the power MOSFET of FIG. 1, the $p^+(p)$ diffusion region 11A is disposed away from the p-type diffusion region 3 while being connected to the source electrode 8, and the lower portion 11Aa of the $p^+(p)$ diffusion region 11A is located deeper than the lower portion 3a of the p-type diffusion region 3. Therefore, the semiconductor layer 100 is thinner beneath the $p^+(p)$ diffusion region 11A which is the fourth semiconductor region than beneath the p-type diffusion region 3 which is the first semiconductor region, and the avalanche current which is produced when an avalanche breakdown occurs in the power MOSFET flows into the p-type (p) diffusion region 11A. This means that the avalanche current flows away form the parasitic npn transistor consisting of the n+ diffusion region 12, the p-type diffusion region 3 and the n+ source region 4, and in other words, this reduces the avalanche current flowing into the parasitic npn transistor, resulting in improvement in withstand avalanche voltage.

Figure 21:
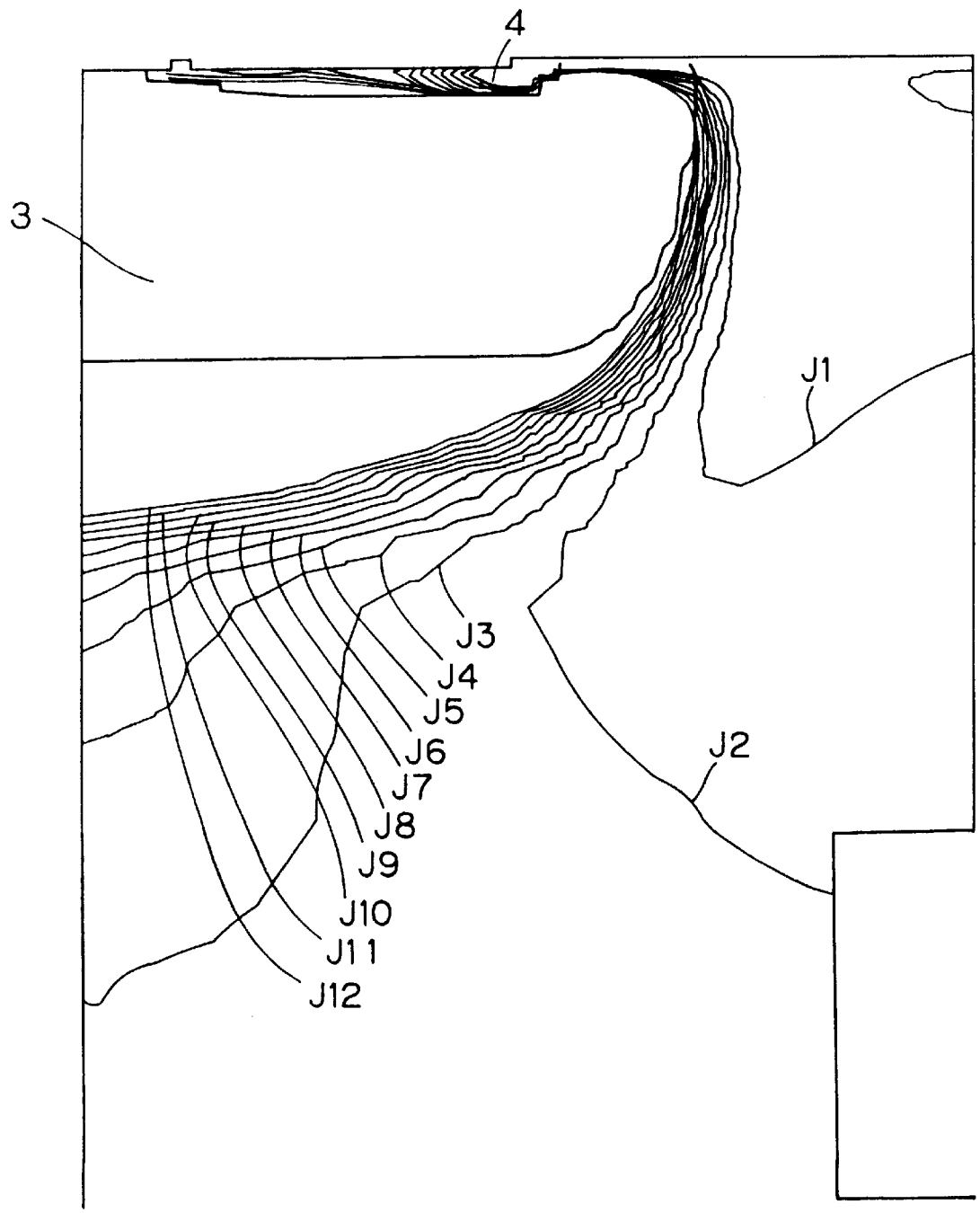
FIG. 21 is a graph showing a simulation result of the on-resistance of the power MOSFET in the prior art.
Figure 22:
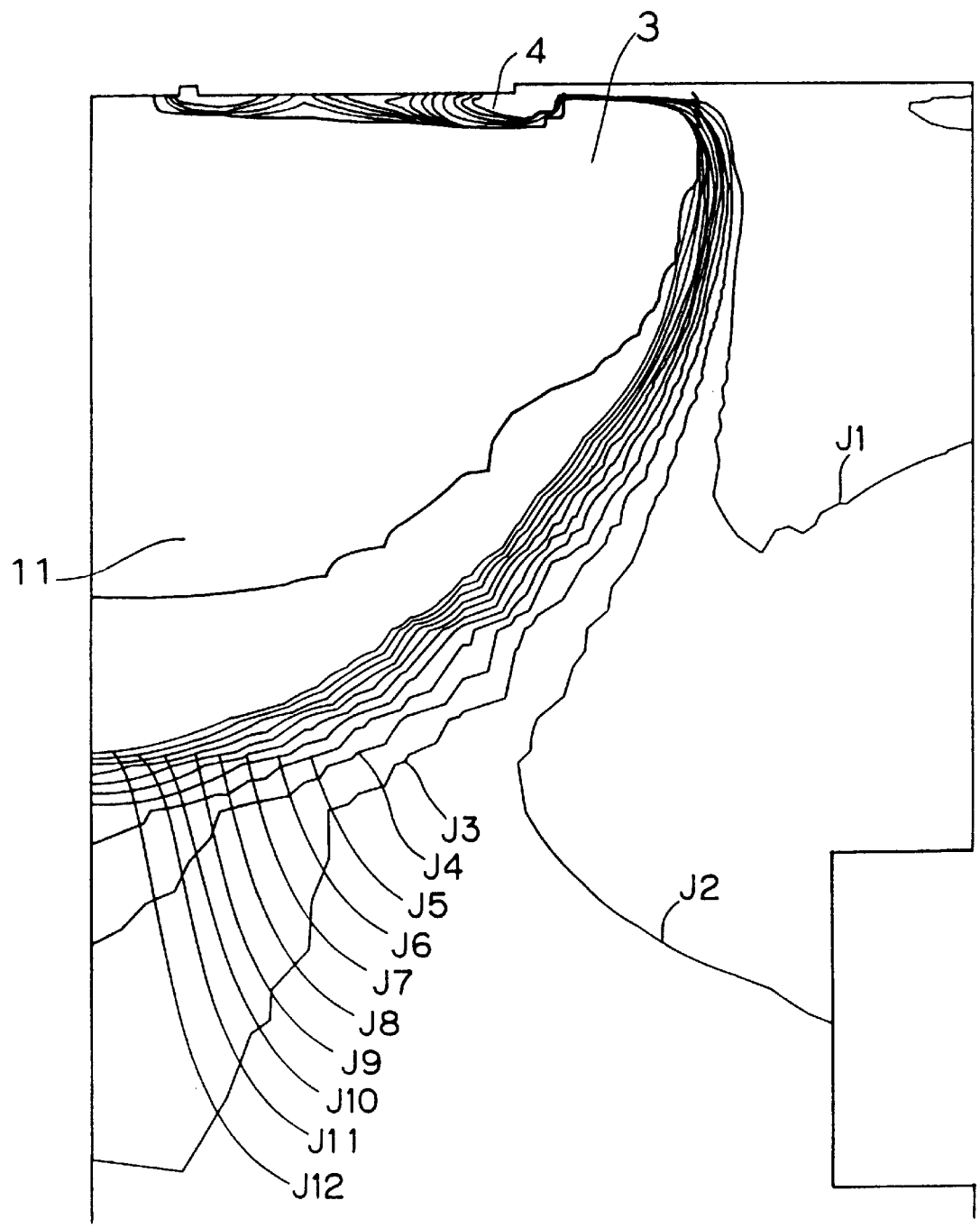
FIG. 22 is a graph showing another simulation result of the on-resistance of the power MOSFET in the prior art.
Figure 23:
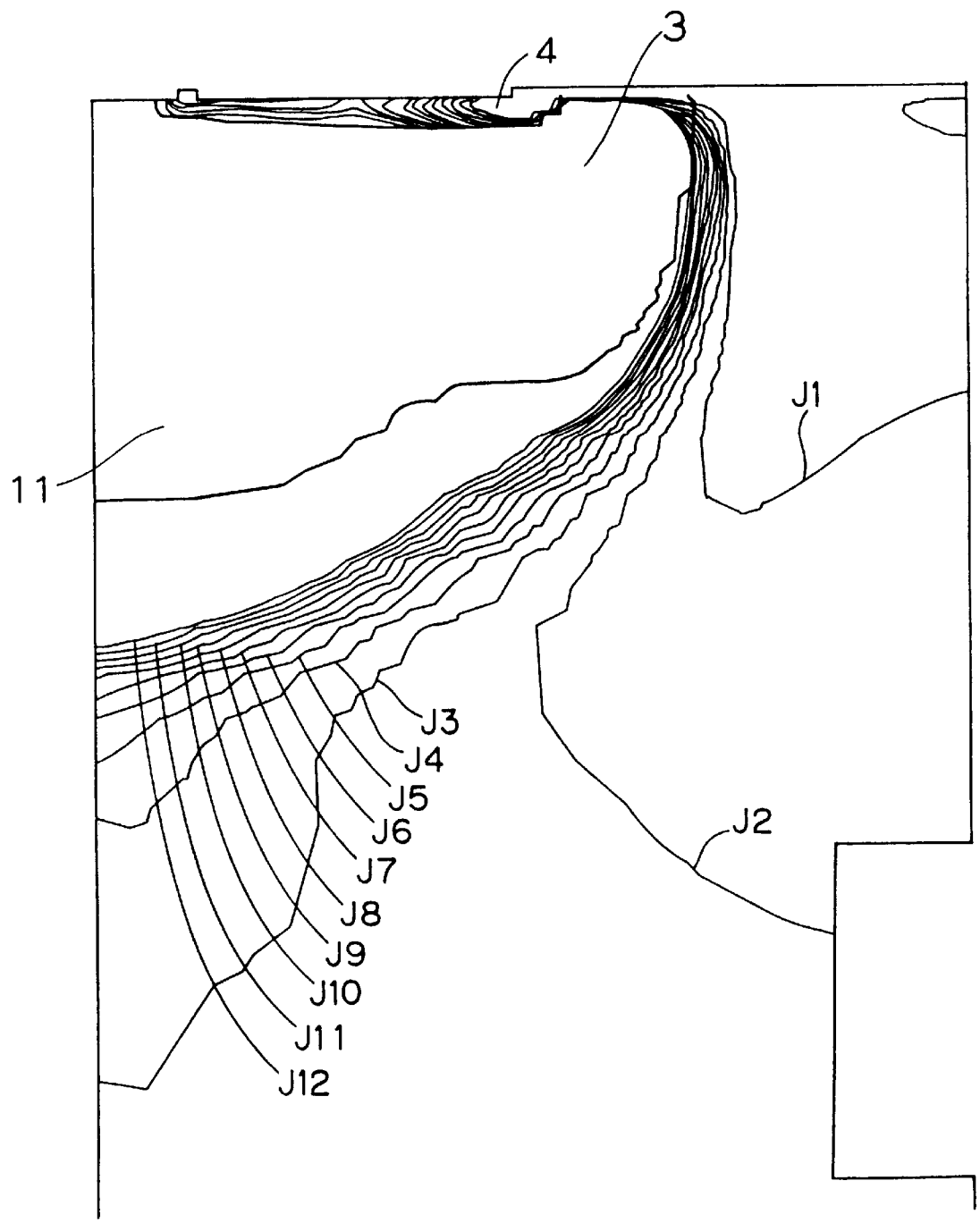
FIG. 23 is a graph showing still another simulation result of the on-resistance of the power MOSFET in the prior art.

Since the n+ semiconductor region 12 is formed beneath the lower portion 3a of the p-type diffusion region 3, the power MOSFET of the first preferred embodiment has an on-resistance lower than the prior-art one. As discussed with reference to FIGS. 21 to 23, providing a region of low resistance like the n+ semiconductor region 12 beneath the lower portion 3a of the p-type diffusion region 3 reduces the on-resistance because a portion of high current density exists also beneath the lower portion 3a of the p-type diffusion region 3.

Further, since no n+ diffusion region 12 is disposed beneath the lower portion 11Aa of the p+(p) diffusion region 11A, it is possible to suppress reduction of the withstand avalanche voltage and the main withstand voltage as compared with the prior art.

Figure 5:
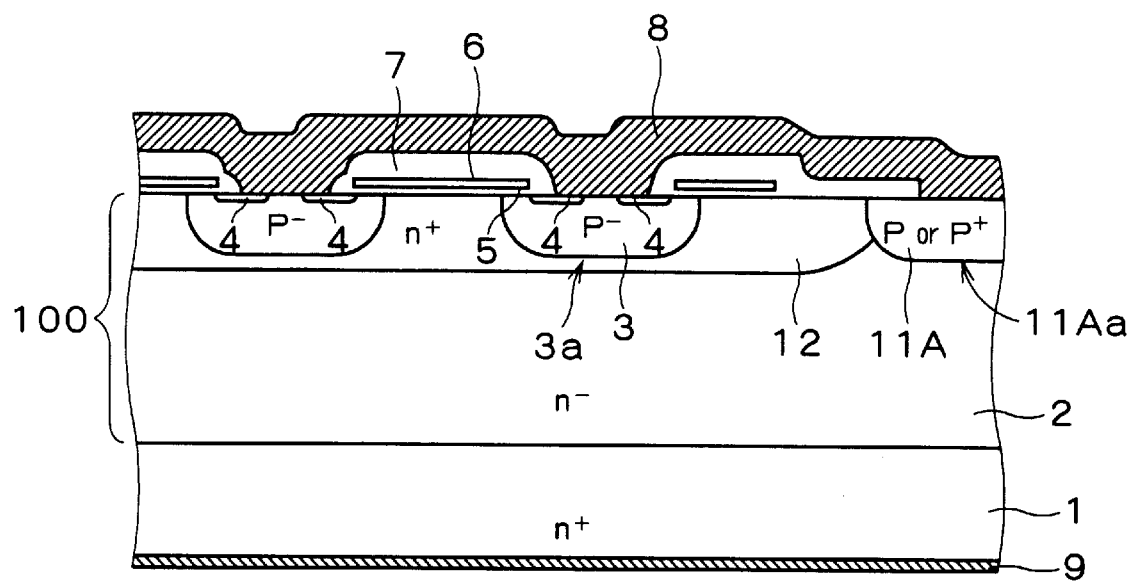
FIG. 5 is a schematic section showing another structural example of the power MOSFET in accordance with the first preferred embodiment.
Figure 6:
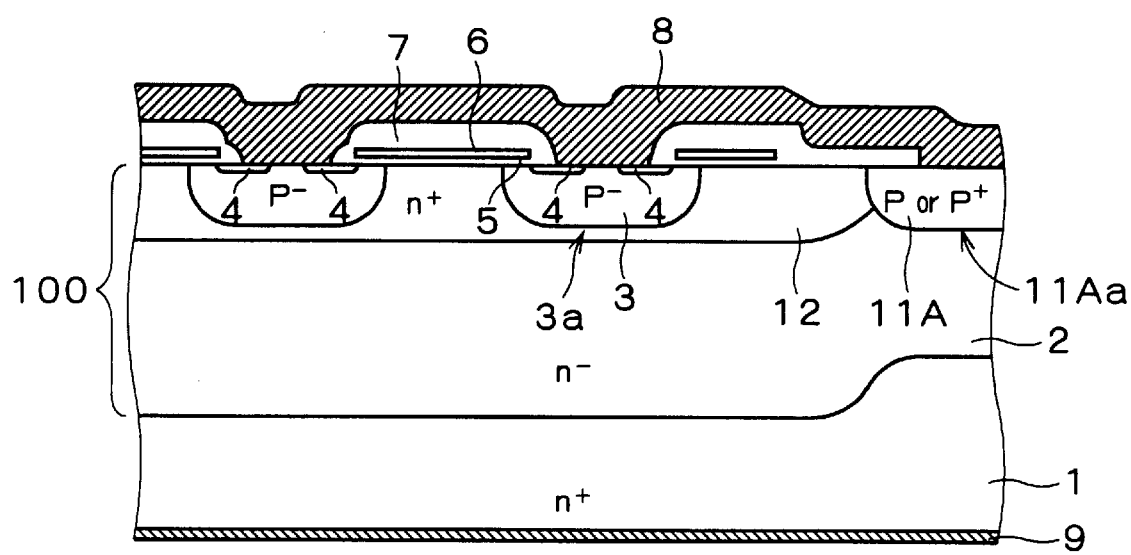
FIG. 6 is a schematic section showing the third structural example of the power MOSFET in accordance with the first preferred embodiment.

Though FIG. 1 shows a case where the lower portion 11Aa of the p+(p) diffusion region 11A is deeper than the lower portion 3a of the p-type diffusion region 3, the lower portion 11Aa of the p+(p) diffusion region 11A may be disposed shallower and closer to the surface of the n− semiconductor region 2 as shown in FIG. 5 if there is sufficient withstand avalanche voltage. With this structure, the n− semiconductor region 2 becomes thinner on the whole to further reduce the on-resistance. When the p+(p) diffusion region 11A is formed shallower, a region for forming the n+ semiconductor region 12 has to be two-dimensionally limited by masking and so on in the manufacturing process lest the n+ semiconductor region 12 should be formed beneath the p+(p) diffusion region 11A. Furthermore, as shown in FIG. 6, by forming the n+ semiconductor substrate 1 so as to be thicker beneath the p+(p) diffusion region 11A, the n− semiconductor region 2 becomes thinner beneath the p+(p) diffusion region 11A than beneath the p-type diffusion region 3, to improve the withstand avalanche voltage, even if the p+(p) diffusion region 11A is formed shallower. For obtaining the thinner n− semiconductor region 2 beneath the p+(p) diffusion region 11A, it is easier to form the p+(p) diffusion region 11A deeper than to form the n+ semiconductor substrate 1 thicker beneath the p+(p) diffusion region 11A.

The Second Preferred Embodiment

Figure 7:
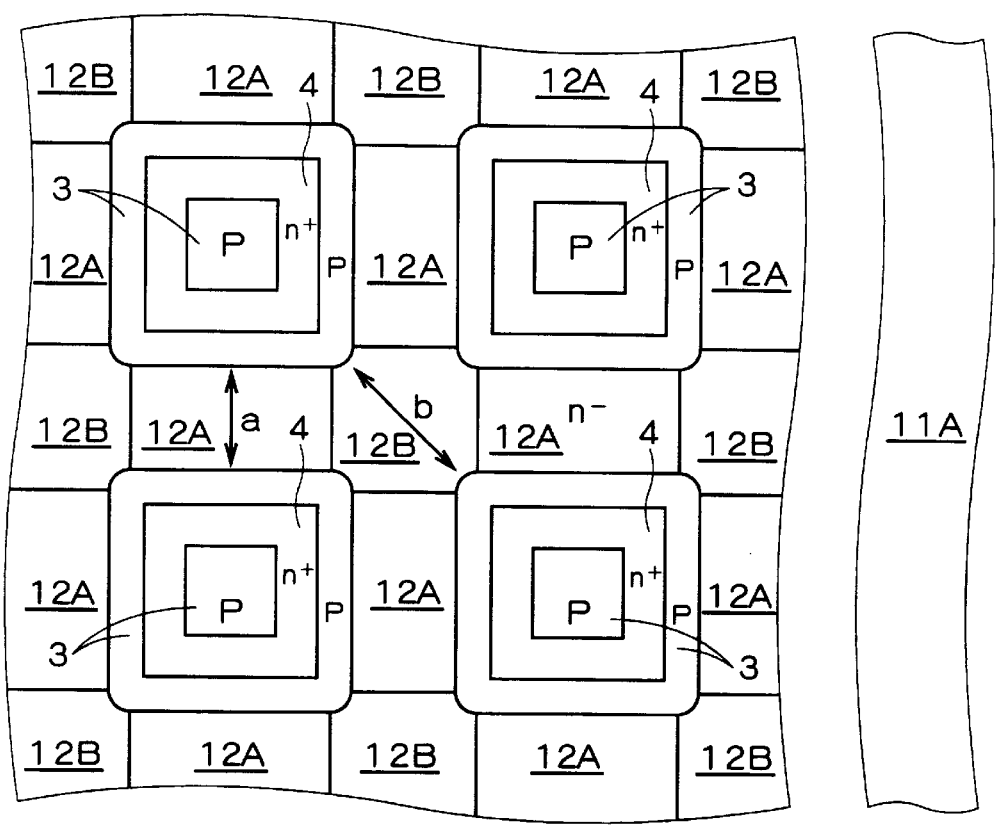
FIG. 7 is a pattern view showing a pattern of impurity of a power MOSFET in accordance with a second preferred embodiment when viewed from the front.

Now, a field effect semiconductor device in accordance with the second preferred embodiment of the present invention will be discussed below. Discussion will be made taking a power MOSFET for example of the field effect semiconductor device of the second preferred embodiment. FIG. 7 is a pattern view showing a pattern of impurity formed in a one-side major surface of the semiconductor layer of the power MOSFET in accordance with the second preferred embodiment when viewed from the front. In the pattern view of FIG. 7, unlike that of FIG. 15, n+ semiconductor regions 12A and 12B are provided in the one-side major surface of the semiconductor layer 100, instead of the n− semiconductor region 2. The n+ semiconductor regions 12A and 12B correspond to the n+ semiconductor region 12 of FIG. 1. A portion shown in FIG. 7 among the n+ semiconductor regions 12A and 12B corresponds to either of first and second exposed regions. Therefore, the n+ semiconductor regions 12A and 12B each have the same sectional shape as that of the n+ semiconductor region 12 FIG. 1 or 5. Specifically, the n+ semiconductor regions 12A and 12B are so formed as to extend from the surface of the semiconductor layer 100 up to beneath the lower portion 3a of the p-type diffusion region 3 and disposed on the periphery of the p-type diffusion region 3 like the n+ semiconductor region 12. Further, the n+ diffusion regions 12A and 12B are not formed beneath the p+(p) diffusion region 11A like the n+ semiconductor region 12. The n+ semiconductor regions 12A and 12B each have an impurity concentration higher than that of the n− semiconductor region 2 like the n+ semiconductor region 12.

The power MOSFET of the second preferred embodiment is characterized in that the n+ semiconductor regions 12A and 12B have different impurity concentrations. The relation of the withstand avalanche voltage, the withstand voltage and the on-resistance is different between a portion where the p-type diffusion regions 3 are opposed to each other with a narrow spacing a and a portion where the p-type diffusion regions 3 are opposed with a wide spacing b. It is harder to obtain a high withstand voltage in the n+ semiconductor region 12B provided in the wide spacing b than in the n+ semiconductor region 12A provided in the narrow spacing a. In the region having the wide spacing b, to ensure the high withstand voltage, the impurity concentration N(b) of the n+ semiconductor region 12B is determined lower. On the other hand, the impurity concentration N(a) of the n+ semiconductor region 12A is determined higher that the impurity concentration N(b) since it is easier to obtain a high withstand voltage in the n+ semiconductor region 12A. This allows reduction of on-resistance without deteriorating the withstand avalanche voltage.

Figure 19:
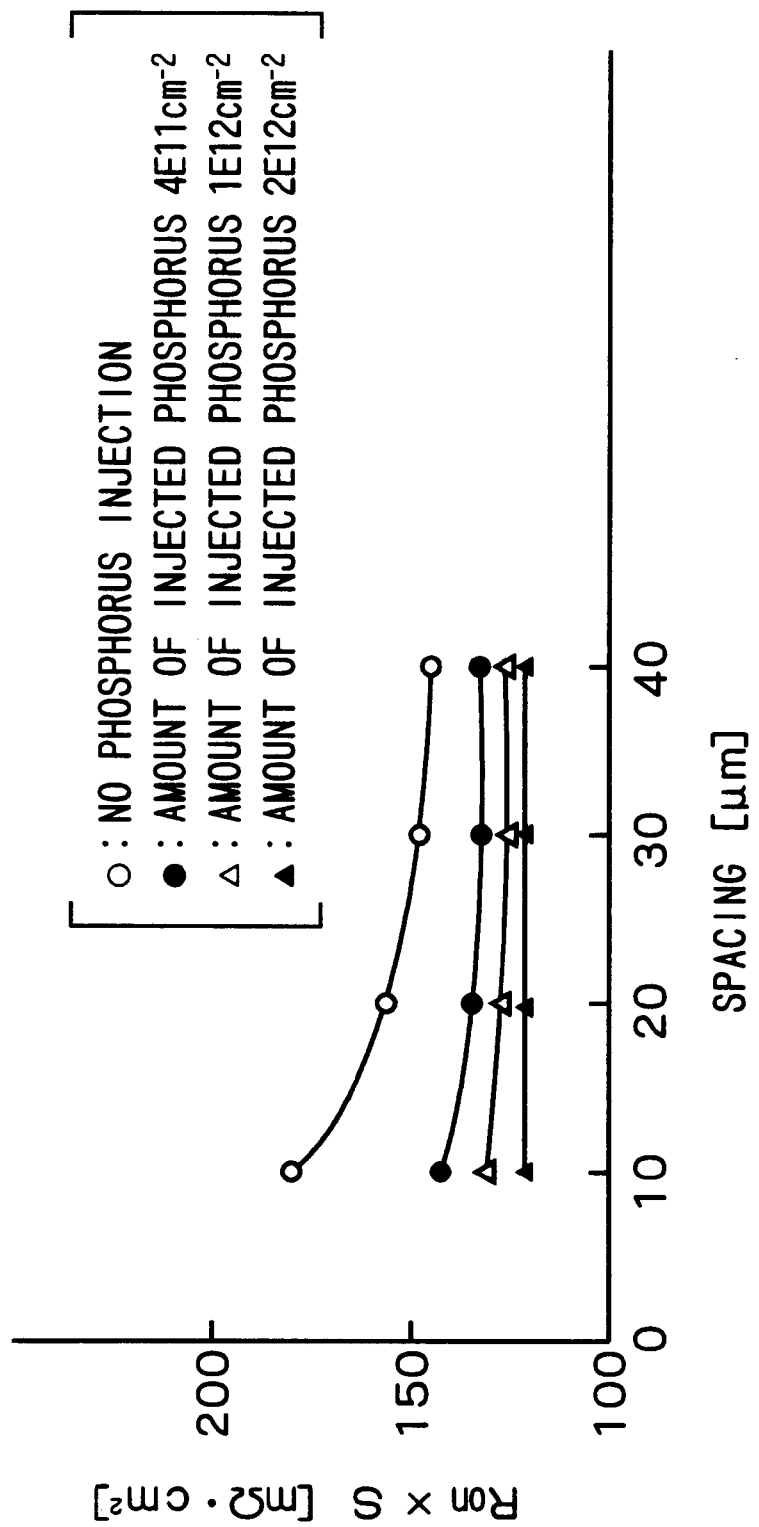
FIG. 19 is a view showing a correlation of a spacing between p-type diffusion regions, the amount of injected phosphorus and an on-resistance.
Figure 20:
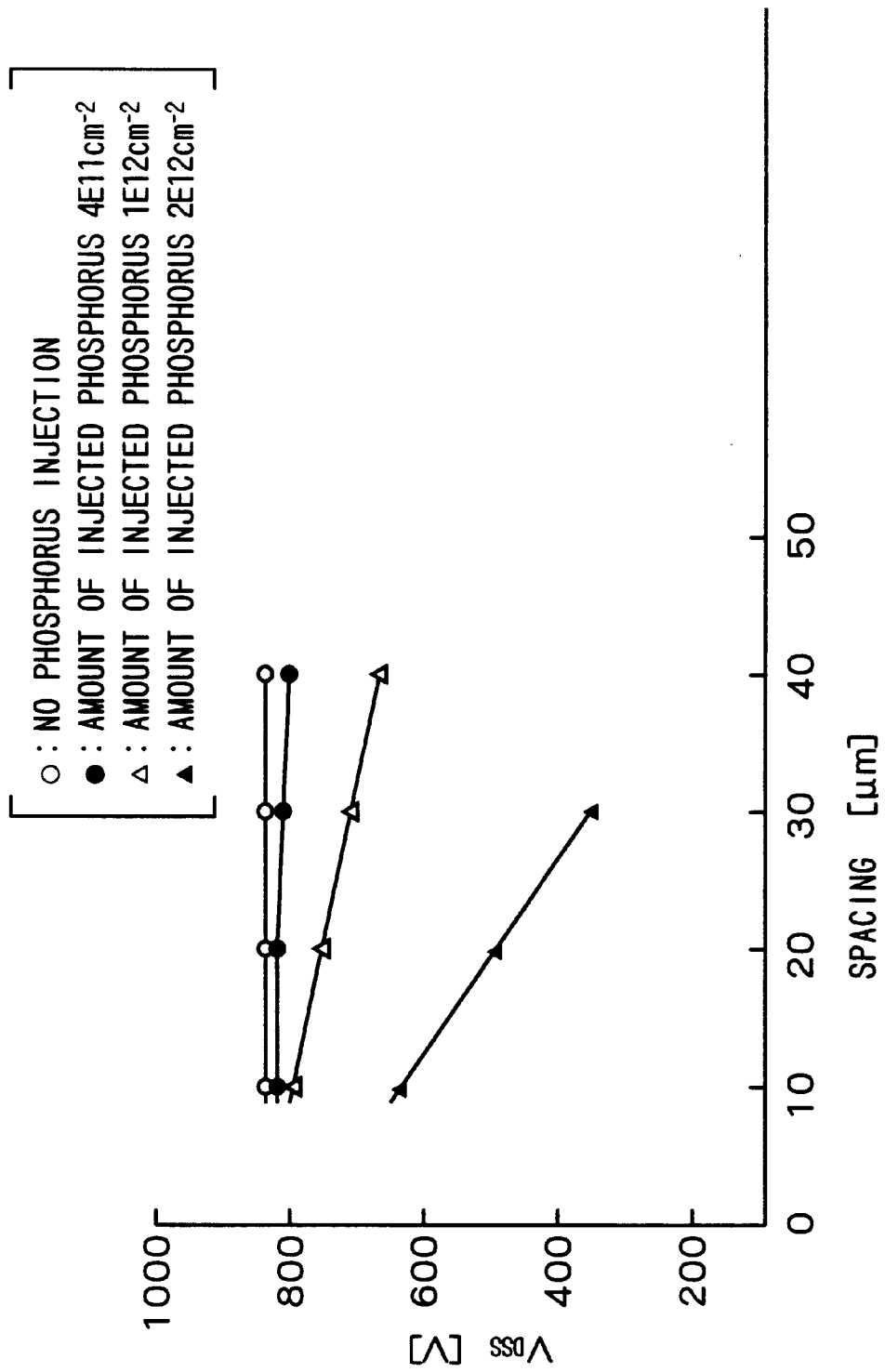
FIG. 20 is a view showing a correlation of the spacing between the p-type diffusion regions, the amount of injected phosphorus and a withstand voltage of the MOSFET.

It is preferable that the impurity concentrations N(a) and N(b) of the n+ semiconductor regions 12A and 12B should be optimized by making the impurity concentrations N(a) and N(b) different. In order for that, the impurity concentrations N(a) and N(b) should be determined in accordance with the spacings a and b, respectively. The impurity concentrations N(a) and N(b) should be determined on the basis of the relation of the amount of phosphorus injected for forming the n+ semiconductor region 12, the spacing between the p-type diffusion regions 3, the withstand voltage $V_{DSS}$ and the on-resistance as shown in FIGS. 19 and 20.

In a case of the power MOSFET having the pattern of FIG. 7, it is possible to obtain the relation between the impurity concentrations N(a) and N(b) from the relation between a depletion layer width Wd and an applied voltage V. The depletion layer width Wd can be approximately obtained from Formula 3. In Formula 3, reference signs $\epsilon s$, Vbi, V, q and $N_B$ represent the permittivity of the semiconductor, a built-in potential, the applied voltage, the amount of elementary electric charges and the impurity concentration, respectively.

$$Wd = \left\{ \frac{2 \cdot \epsilon s \cdot (Vbi - V)}{q \cdot N_B} \right\}^{\frac{1}{2}} \quad (3)$$

When a voltage $V_R$ is applied to the device, depletion layers extending from the opposed p-type diffusion regions 3 reach in a region between the opposed p-type diffusion regions 3 with the spacing a and a region between the p-type diffusion regions 3 with the spacing b, and therefore Formulae 4 and 5 are approximately held:

$$\frac{a}{2} = \left\{ \frac{2 \cdot \varepsilon s \cdot V_R}{q \cdot N(a)} \right\}^{\frac{1}{2}} \quad (4)$$

$$\frac{b}{2} = \left\{ \frac{2 \cdot \varepsilon s \cdot V_R}{q \cdot N(b)} \right\}^{\frac{1}{2}} \quad (5)$$

Between the spacings a and b, there is a relation that the spacing b is equals to a product of the spacing a and the square root of 2 when the MOS unit cell is disposed like a grid. From this relation and the relations of Formulae 4 and 5, it can be derived that the impurity concentration N(a) should be two times the impurity concentration N(b). When the impurity concentrations N(a) and N(b) are determined, holding this relation, in FIG. 7, the n+ semiconductor region 12A in the spacing a and the n+ semiconductor region 12B in the spacing b have the same voltage (pinch-off voltage) at a portion where the depletion layers extending from the p-type diffusion regions 3 reach. In other words, the impurity concentration N(a) of the n+ diffusion region 12A is determined more appropriately. In this case, the impurity concentration N(a) of the n+ diffusion region 12A becomes twice that in the prior art and the on-resistance of the n+ diffusion region 12A decreases. Therefore, the on-resistance of the power MOSFET decreases on the whole.

Figure 8:
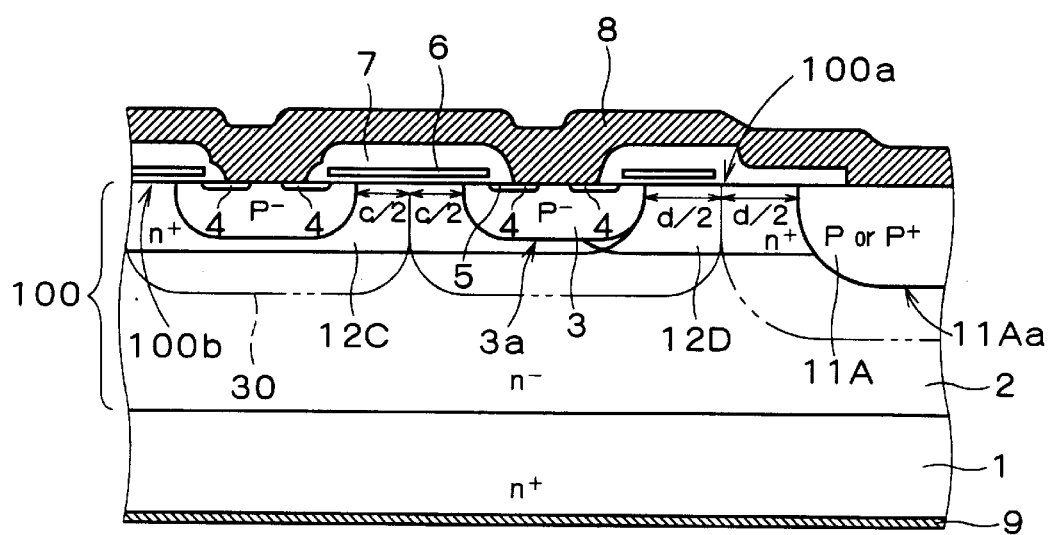
FIG. 8 is a schematic section showing an example of sectional structure of the power MOSFET in accordance with the second preferred embodiment.

Next, discussion will be made on a case where spacings between the p-type diffusion regions in the surface of the semiconductor layer are different in a portion other than the unit cell of the power MOSFET. FIG. 8 shows an example of sectional structure of the power MOSFET of the second preferred embodiment in the case of the spacings between the p-type diffusion regions. One of the p-type diffusion regions is different in a portion other than the unit cell. The power MOSFET of FIG. 8 is different from that of FIG. 1 in impurity concentrations of the n+ diffusion regions 12, 12C and 12D. While the n+ diffusion region 12 of FIG. 1 has an impurity concentration distribution which is two-dimensionally uniform, exposed regions 100a and 100b of the n+ diffusion regions 12C and 12D of FIG. 8 have different impurity concentrations. Determination of the impurity concentrations of the n+ diffusion regions 12C and 12D of FIG. 8 is made in the same manner as that of the n+ diffusion regions 12A and 12B of FIG. 7. Assuming that a spacing c is narrower than a spacing d in FIG. 8, Formulae 6 and 7 are held from a relation between the spacings c and d and the depletion layers 30 created therein. In Formulae 6 and 7, reference signs V1, V2, Ks, ∈o, qe, N(c) and N(d) represent the pinch-off voltage of the n+ diffusion region 12C, the pinch-off voltage of the n+ diffusion region 12D, the relative permittivity of the semiconductor, the absolute permittivity, the amount of electron charges, the impurity concentration of the n+ diffusion region 12C and the impurity concentration of the n+ diffusion region 12D, respectively.

$$V1 = \frac{qe \cdot N(c)}{2 \cdot K_s \cdot \varepsilon 0} \cdot \left(\frac{c}{2}\right)^2 \quad (6)$$

$$V2 = \frac{qe \cdot N(d)}{2 \cdot K_s \cdot \varepsilon 0} \cdot \left(\frac{c}{2}\right)^2 \quad (7)$$

Since the pinch-off voltage V1 of the n+ diffusion region 12C should not be lower than the pinch-off voltage V2 of the n+ diffusion region 12D, it can be derived from Formulae 6 and 7 that the product of the square of the spacing c and the impurity concentration N(c) should not be lower than the product of the square of the spacing d and the impurity concentration N(d). With this determination, the impurity concentration of the n+ diffusion region 12C can be made higher than that of the prior art, and therefore the on-resistance of the n+ diffusion region 12C and further the on-resistance of the whole power MOSFET can be reduced.

Figure 9:
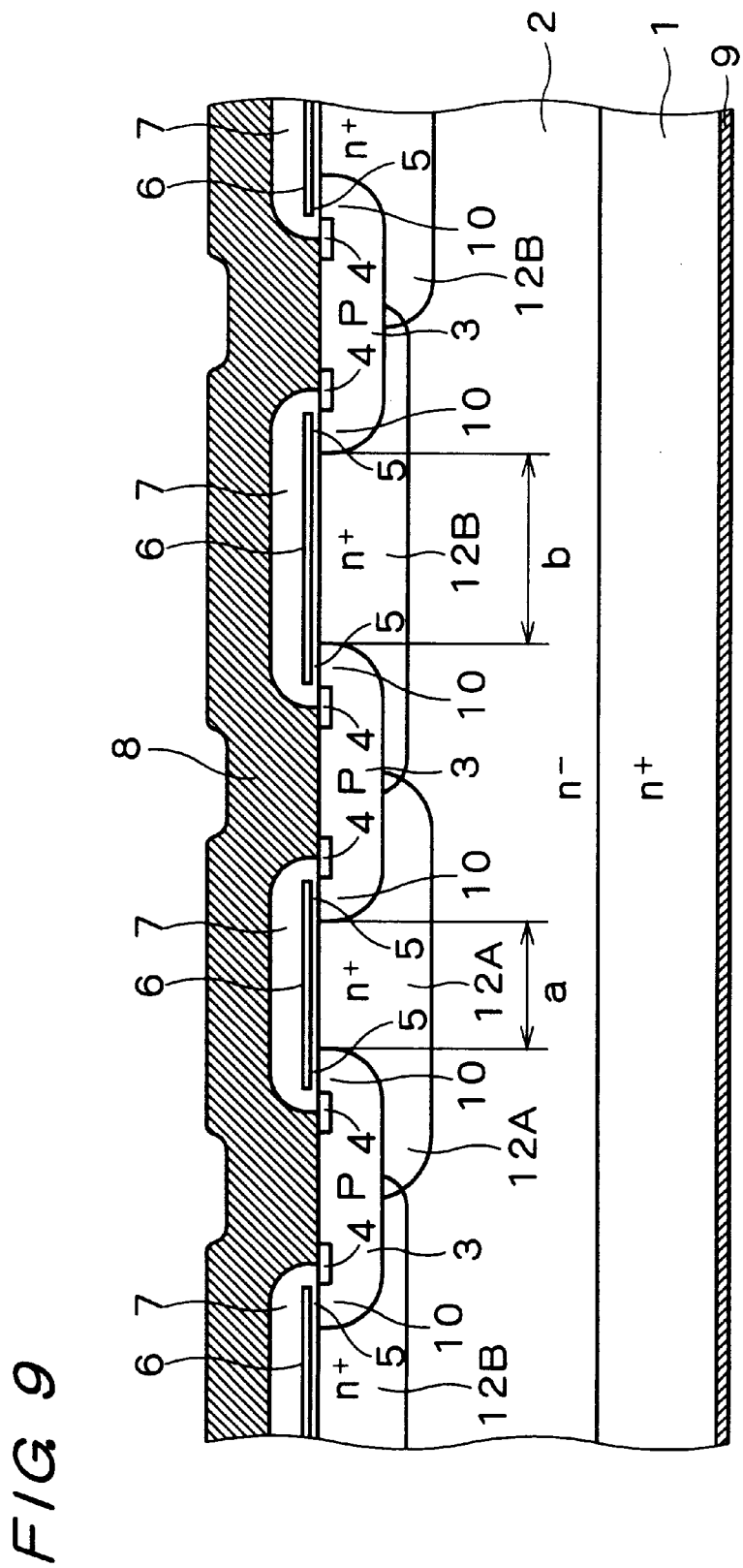
FIG. 9 is a schematic section showing the second example of sectional structure of the power MOSFET in accordance with the second preferred embodiment.

Though the above discussion has been made taking the case where two n+ diffusion regions 12A and 12B or 12C and 12D are provided in one power MOSFET, more regions which are divided for different impurity concentrations may be provided in accordance with the spacings between the p-type diffusion regions 3 and between the p+(p) diffusion regions 11A. Further, as shown in FIG. 9, the depths of the n+ diffusion regions 12A and 12B may be changed so that a region of high impurity concentration (the n+ diffusion region 12A) may be deeper than a region of low impurity concentration (the n+ diffusion region 12B). Though the relative relation of impurity concentration between the n+ diffusion regions 12A and 12B depends on the spacing between the p-type diffusion regions 3 and the spacing between the p-type diffusion region 3 and the p+(p) diffusion region 11A, the absolute value of impurity concentration is determined in consideration of other elements. In this case, optimization of the relation between the withstand avalanche voltage and the on-resistance using both the depths and the impurity concentrations of the n+ diffusion regions 12A and 12B allows improvement in degree of freedom for design.

Figure 10:
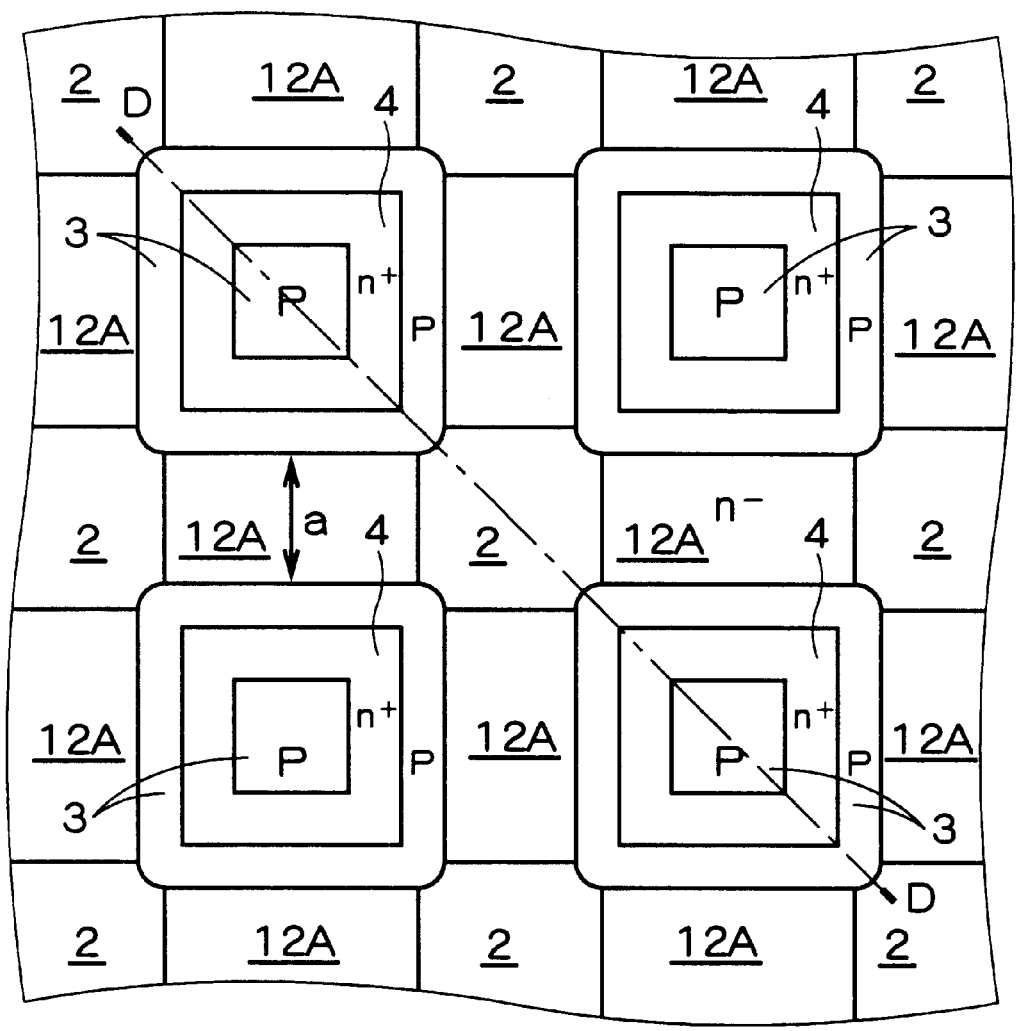
FIG. 10 is a schematic section showing an example of planar structure of the power MOSFET in accordance with the second preferred embodiment.
Figure 11:
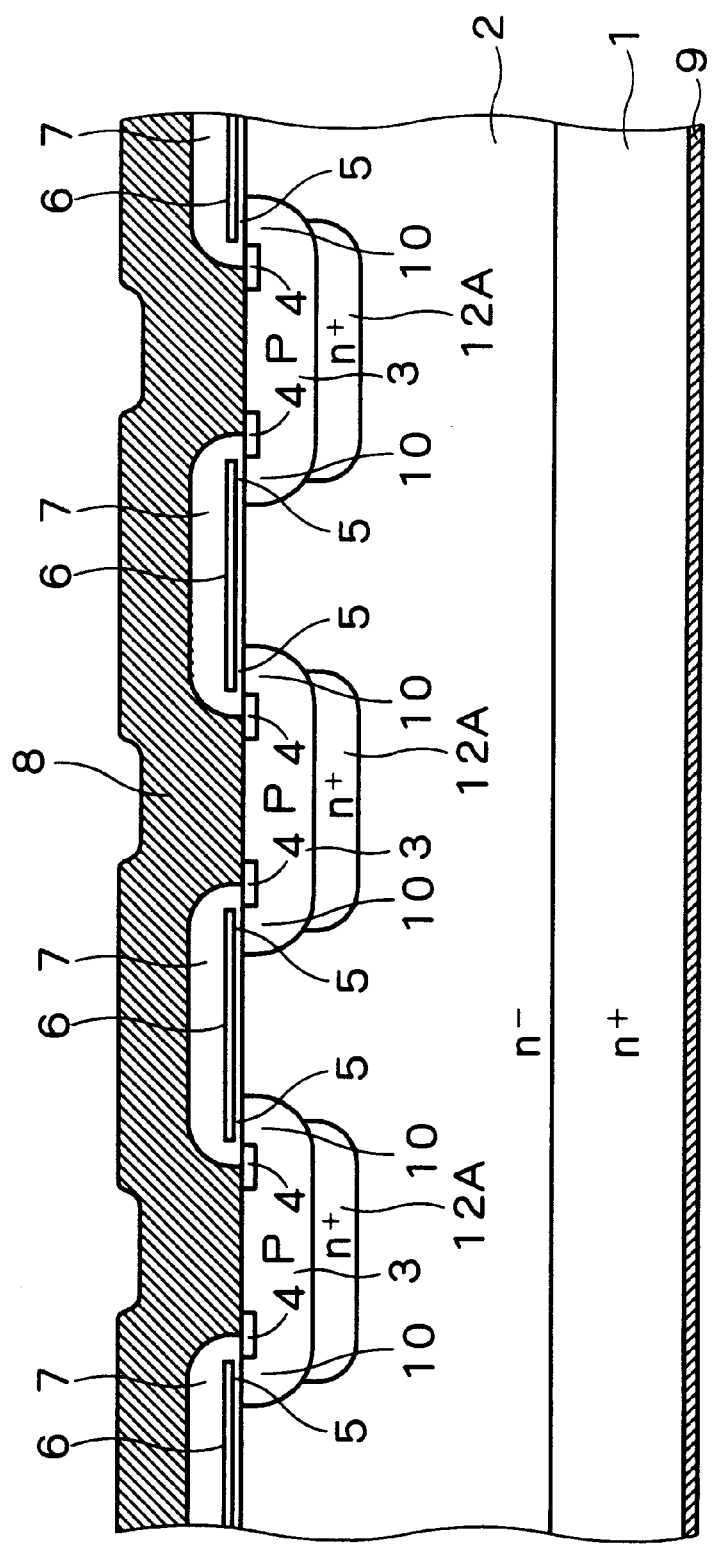
FIG. 11 is a schematic section showing the third example of sectional structure of the power MOSFET in accordance with the second preferred embodiment.

In a case where the impurity concentrations and the depths of the n+ diffusion regions 12A to 12D are determined over a plurality of regions, since the number of steps for manufacturing the power MOSFET having such regions 12A to 12D increases, the n− semiconductor region 2 may be exposed to the surface without forming the n+ diffusion regions 12B and 12D as shown in FIGS. 10 and 11. In this case, an n+ diffusion region 12A and the n− semiconductor region 2 existing in the one-side surface of the semiconductor layer of FIG. 10 correspond to the first and second exposed regions, respectively. The n− semiconductor region 2 to be exposed may be the whole region corresponding to the n+ diffusion regions 12B and 12D or part of the region.

The Third Preferred Embodiment

Figure 12:
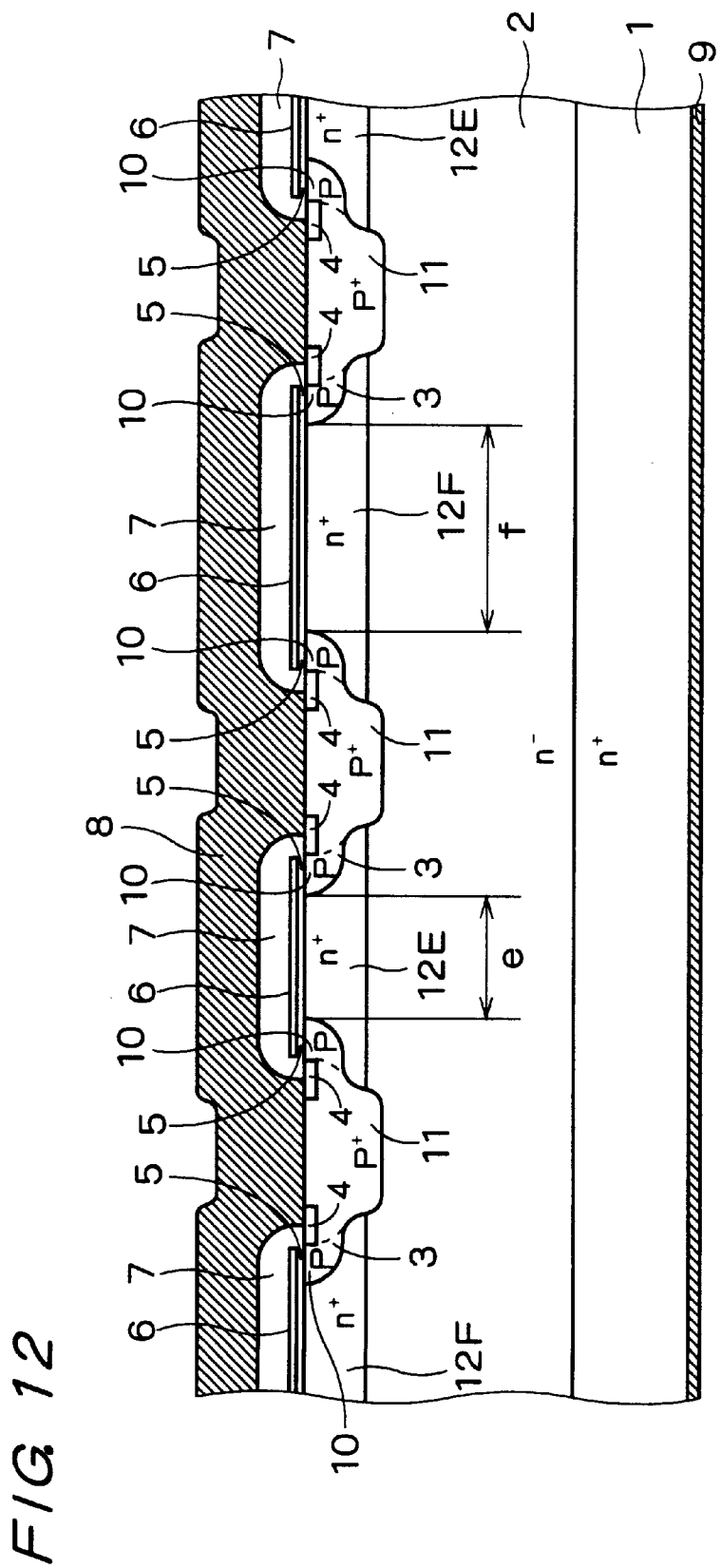
FIG. 12 is a schematic section showing an example of sectional structure of a power MOSFET in accordance with a third preferred embodiment.
Figure 18:
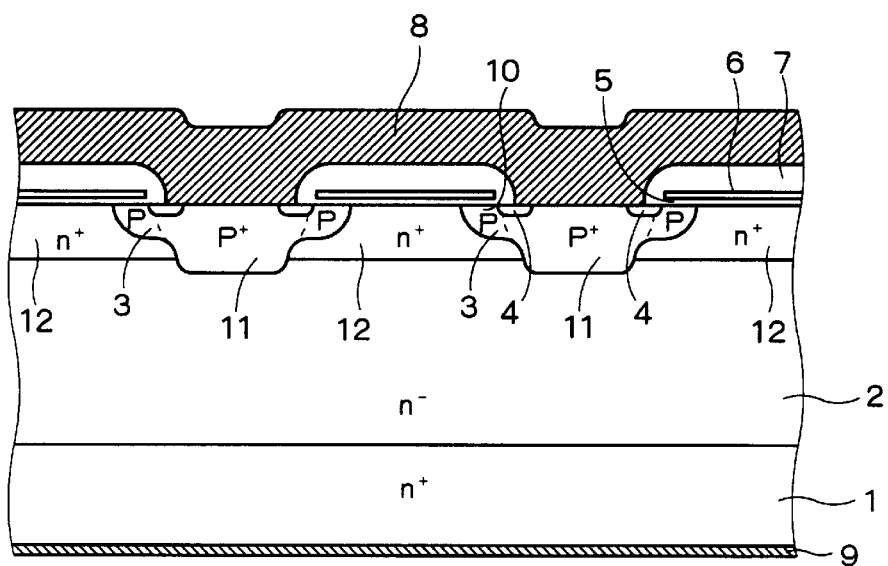
FIG. 18 is a schematic section showing another example of sectional structure of the power MOSFET in the prior art.

Now, a field effect semiconductor device in accordance with the third preferred embodiment of the present invention will be discussed below. Discussion will be made taking a power MOSFET for example of the field effect semiconductor device of the third preferred embodiment. The power MOSFET of FIG. 12 of the third preferred embodiment is a vertical power MOSFET like the prior-art power MOSFET of FIG. 18. In the power MOSFET of FIG. 12, respective impurity concentrations of n+ diffusion regions 12E and 12F are determined in accordance with the spacings between the p-type diffusion regions 3, like in the field effect semiconductor device of the second preferred embodiment. Also in the power MOSFET having the p+ diffusion region 11 shown in FIG. 12, such determination as to optimize the relation between the on-resistance and the withstand avalanche voltage in a portion having a narrow spacing between the p-type diffusion regions 3 is made, and therefore the power MOSFET of the third preferred embodiment can reduce the on-resistance without deteriorating the withstand avalanche voltage like the power MOSFET of the second preferred embodiment.

Figure 13:
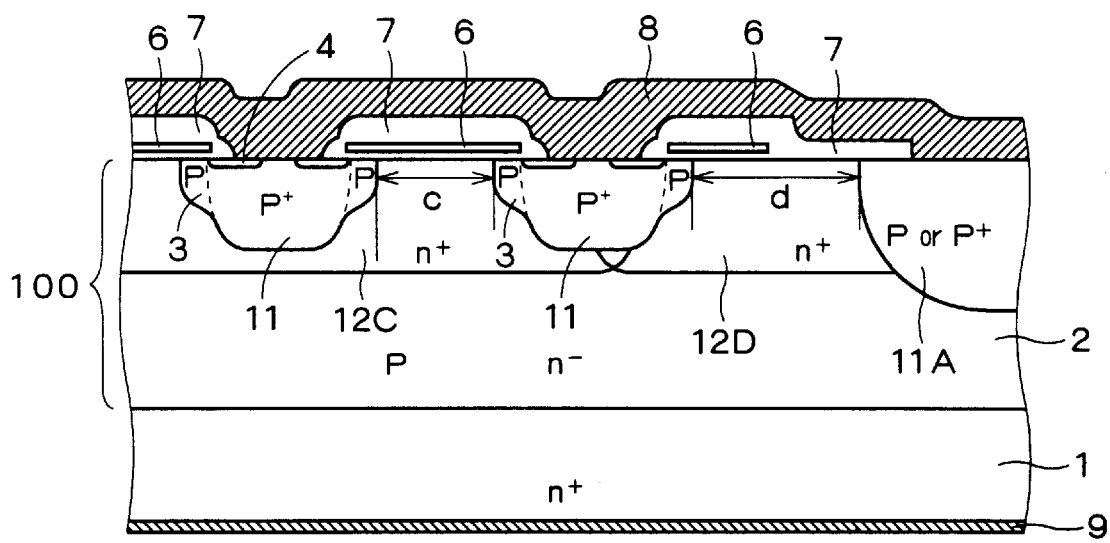
FIG. 13 is a schematic section showing the second example of sectional structure of the power MOSFET in accordance with the third preferred embodiment.
Figure 14:
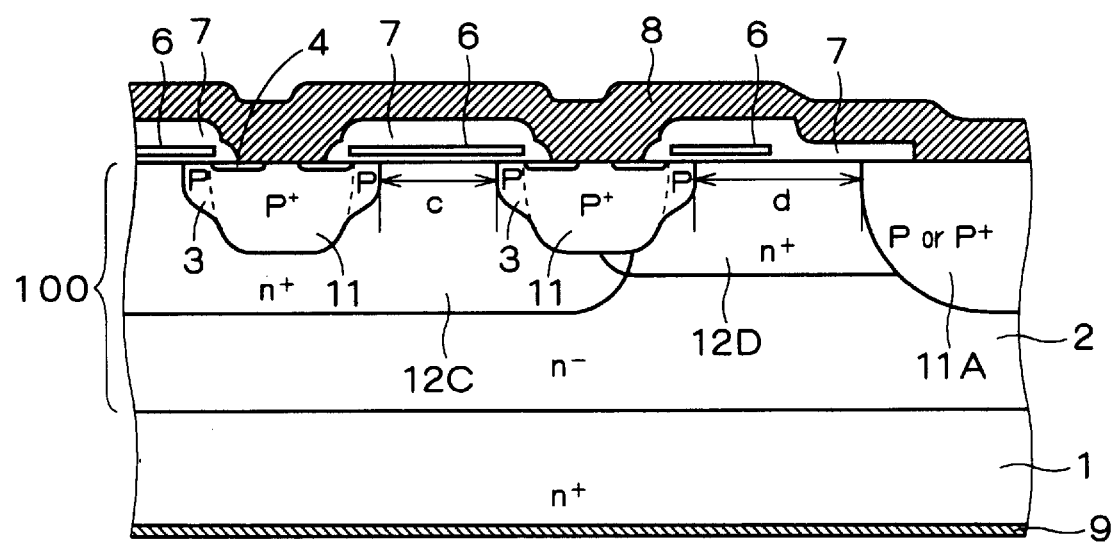
FIG. 14 is a schematic section showing the third example of sectional structure of the power MOSFET in accordance with the third preferred embodiment.

Further, in the power MOSFET having he p+ diffusion region 11 as shown in FIG. 13, it is possible to determine the respective impurity concentrations of the n⁺ semiconductor regions 12C and 12D in accordance with the spacing c between the p-type diffusion regions 3 and the spacing d between the p-type diffusion region 3 and the p⁺(p) diffusion region 11A. As discussed with reference to FIG. 8, by separately determining the impurity concentrations of the n⁺ semiconductor regions 12C and 12D so that the relation between the on-resistance and the withstand avalanche voltage may be optimized, the power MOSFET of the third preferred embodiment can reduce the on-resistance without deteriorating the withstand avalanche voltage like the power MOSFET of the second preferred embodiment. In this case, by forming the n⁺ semiconductor regions 12C and 12D deeper than the p⁺ diffusion region 11 to exist beneath the lower portion of the p⁺ diffusion region 11, the third preferred embodiment produces an effect of reducing the on-resistance like the first preferred embodiment. The p⁺ diffusion region 11 corresponds to the fifth semiconductor region.

The depths of the n⁺ diffusion regions 12A and 12B may be changed so that a region of high impurity concentration (the n⁺ diffusion region 12C) may be deeper than a region of low impurity concentration (the n⁺ diffusion region 12D), and that produces the same effect as the power MOSFET of the second preferred embodiment. Thus, such determination as to optimize the relation between the withstand avalanche voltage and the on-resistance, using both the depths and impurity concentrations of the n⁺ diffusion regions 12C and 12D, allows improvement in degree of freedom for design.

Though discussion has been made taking an n channel power MOSFET in the above first to third preferred embodiments, the present invention is applicable to a p channel MOSFET having reverse polarity of semiconductor and it is obvious that the same effect can be produced. There are an insulated gate bipolar transistor (IGBT) and a MOS controlled thyristor as field effect semiconductor devices, other than a power MOSFET, to which the present invention is applicable.

While the invention has been shown and described in detail, the foregoing description is in all aspects illustrative and not restrictive. It is therefore understood that numerous modifications and variations can be devised without departing from the scope of the invention.

We claim:

1. A field effect semiconductor device comprising a semiconductor layer of a first conductivity type having a one-side major surface and an other-side major surface which are opposed to each other,
    said semiconductor layer including
        a first semiconductor region of a second conductivity type disposed like an island in said one-side major surface of said semiconductor layer,
        a second semiconductor region of the first conductivity type provided in a surface of said first semiconductor region so that its side of said semiconductor layer may be covered with said first semiconductor region,
        a third semiconductor region of the first conductivity type disposed in said one-side major surface of said semiconductor layer, extending from said one-side major surface of said semiconductor layer on the periphery of said first semiconductor region to beneath a lower portion of said first semiconductor region, and
    a fourth semiconductor region of the second conductivity type disposed in said one-side major surface of said semiconductor layer away from said first semiconductor region,
    said field effect semiconductor device further comprising:
        an insulating film covering a portion of a surface of said second semiconductor region and a channel region which exists between said second semiconductor region and said third semiconductor region in said surface of said first semiconductor region;
        a gate electrode provided on said insulating film above said channel region,
        a source electrode disposed so as to come into a contact with said first, second and fourth semiconductor regions; and
        a drain electrode connected to said other-side major surface of said semiconductor layer,
    wherein said third semiconductor region has an impurity concentration higher than that of said semiconductor layer surrounding said third semiconductor region and is disposed in a portion except beneath a lower portion of said fourth semiconductor region, and
    said semiconductor layer is thinner beneath said fourth semiconductor region than beneath said first semiconductor region.

2. The field effect semiconductor device of claim 1, wherein
    said semiconductor layer is thinner beneath said fourth semiconductor region than beneath said first semiconductor region since said fourth semiconductor region is so provided as to extend from said one-side major surface of said semiconductor layer up to a portion deeper than said first semiconductor region.

3. The field effect semiconductor device of claim 2 further comprising
    a fifth semiconductor region of the second conductivity type disposed in said semiconductor layer so as to be shallower than said fourth semiconductor region near the center of said lower portion of said first semiconductor region,
    wherein said third semiconductor region is so disposed as to extend up to beneath said fifth semiconductor region.

4. The field effect semiconductor device of claim 2, wherein
    said semiconductor layer includes a plurality of first semiconductor regions, and
    said semiconductor layer has first and second exposed regions where surfaces of said third semiconductor region are exposed between adjacent ones of said plurality of first semiconductor regions or between one of said plurality of first semiconductor regions and said fourth semiconductor region in said one-side major surface, and an impurity concentration is higher in one of said first and second exposed regions which exists in a narrower spacing between said adjacent ones of said plurality of first semiconductor regions or between said one of said plurality of first semiconductor regions and said fourth semiconductor region.

5. The field effect semiconductor device of claim 4, wherein
    said impurity concentration of said first exposed region and said impurity concentration of said second exposed region in said third semiconductor region are so controlled as to be in inverse proportion to the square of said spacing between said adjacent ones of said plurality of first semiconductor regions or between said one of said plurality of first semiconductor regions and said fourth semiconductor region.

6. The field effect semiconductor device of claim 5, wherein
    one of said first and second exposed regions which exists in said narrower spacing is deeper than the other which exists in a wider spacing.

7. A field effect semiconductor device comprising a semiconductor layer of a first conductivity type having a one-side major surface and an other-side major surface which are opposed to each other,
   said semiconductor layer including
      a plurality of first semiconductor regions of a second conductivity type disposed like islands in said one-side major surface of said semiconductor layer,
      a second semiconductor region of the first conductivity type provided in a surface of each of said plurality of first semiconductor regions so that its side of said semiconductor layer may be covered with each of said plurality of first semiconductor regions,
      a third semiconductor region of the first conductivity type disposed on the periphery of each of said plurality of first semiconductor regions in said one-side major surface of said semiconductor layer, having an impurity concentration higher than that of said semiconductor layer which is adjacent thereto, and
      a fourth semiconductor region of the second conductivity type disposed in said one-side major surface of said semiconductor layer away from each of said plurality of first semiconductor regions,
   said field effect semiconductor device further comprising:
      an insulating film covering a portion of a surface of said second semiconductor region and a channel region which exists between said second semiconductor region and said third semiconductor region in said surface of each of said plurality of first semiconductor regions;
      a gate electrode provided on said insulating film above said channel region,
      a source electrode disposed so as to come into a contact with said first, second and fourth semiconductor regions; and
      a drain electrode connected to said other-side major surface of said semiconductor layer,
   wherein said semiconductor layer has first and second exposed regions where surfaces of said third semiconductor region are exposed between adjacent ones of said plurality of first semiconductor regions or between one of said plurality of first semiconductor regions and said fourth semiconductor region in said one-side major surface, and an impurity concentration is higher in one of said first and second exposed regions which exists in a narrower spacing between said adjacent ones of said plurality of first semiconductor regions or between said one of said plurality of first semiconductor regions and said fourth semiconductor region.

8. The field effect semiconductor device of claim 7, wherein
   said impurity concentration of said first exposed region and said impurity concentration of said second exposed region in said third semiconductor region are so controlled as to be in inverse proportion to the square of said spacing between said adjacent ones of said plurality of first semiconductor regions or between said one of said plurality of first semiconductor regions and said fourth semiconductor region.

9. The field effect semiconductor device of claim 8, wherein
   one of said first and second exposed regions in said third semiconductor region which exists in said narrower spacing is deeper than the other which exists in a wider spacing.

10. The field effect semiconductor device of claim 9 further comprising:
   a fifth semiconductor region of the second conductivity type disposed in said semiconductor layer so as to be shallower than said fourth semiconductor region near the center of a lower portion of each of said plurality of first semiconductor regions,
   wherein said third semiconductor region is so disposed as to extend up to beneath said fifth semiconductor region.

11. A field effect semiconductor device comprising a semiconductor layer of a first conductivity type having a one-side major surface and an other-side major surface which are opposed to each other,
   said semiconductor layer including
      a plurality of first semiconductor regions of a second conductivity type disposed like islands in said one-side major surface of said semiconductor layer,
      a second semiconductor region of the first conductivity type provided in a surface of each of said plurality of first semiconductor regions so that its side of said semiconductor layer may be covered with each of said plurality of first semiconductor regions,
      a third semiconductor region of the first conductivity type disposed on the periphery of each of said plurality of first semiconductor regions in said one-side major surface of said semiconductor layer, having an impurity concentration higher than that of said semiconductor layer which is adjacent thereto, and
      a fourth semiconductor region of the second conductivity type disposed in said one-side major surface of said semiconductor layer away from each of said plurality of first semiconductor regions,
   said field effect semiconductor device further comprising:
      an insulating film covering a portion of a surface of said second semiconductor region and a channel region which exists between said second semiconductor region and said third semiconductor region in said surface of each of said plurality of first semiconductor regions;
      a gate electrode provided on said insulating film above said channel region,
      a source electrode disposed so as to come into a contact with said first, second and fourth semiconductor regions; and
      a drain electrode connected to said other-side major surface of said semiconductor layer,
   wherein said semiconductor layer has a first exposed region where a surface of said third semiconductor region is exposed in a narrower spacing between adjacent ones of said plurality of first semiconductor regions or between one of said plurality of first semiconductor regions and said fourth semiconductor region in said one-side major surface and a second exposed region where said semiconductor layer which has an impurity concentration lower than that of said third semiconductor region is exposed in a wider spacing.

12. The field effect semiconductor device of claim 11 further comprising:
   a fifth semiconductor region of the second conductivity type disposed in said semiconductor layer so as to be shallower than said fourth semiconductor region near the center of a lower portion of each of said plurality of first semiconductor regions,
   wherein said third semiconductor region is so disposed as to extend up to beneath said fifth semiconductor region.

* * * * *